(12) United States Patent
Kim et al.

(10) Patent No.: US 8,691,693 B2
(45) Date of Patent: Apr. 8, 2014

(54) METHODS OF MANUFACTURING SEMICONDUCTOR DEVICE

(75) Inventors: Sang-Jin Kim, Suwon-si (KR); Jong-Chan Shin, Seongnam-si (KR); Yong-Kug Bae, Hwaseong-si (KR); Do-Hyoung Kim, Hwaseong-si (KR); Dong-Woon Park, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/290,285

(22) Filed: Nov. 7, 2011

(65) Prior Publication Data

US 2012/0122286 A1 May 17, 2012

(30) Foreign Application Priority Data

Nov. 11, 2010 (KR) ........................ 10-2010-0111971

(51) Int. Cl.
*H01L 21/44* (2006.01)
*H01L 29/40* (2006.01)

(52) U.S. Cl.
USPC ........................................ 438/672; 257/621

(58) Field of Classification Search
USPC ........... 438/655, 664, 671–675; 257/621, 774
See application file for complete search history.

(56) References Cited

U.S. PATENT DOCUMENTS

| 6,174,803 | B1 * | 1/2001 | Harvey | 438/638 |
| 6,221,760 | B1 * | 4/2001 | Hamada | 438/630 |
| 6,451,708 | B1 * | 9/2002 | Ha | 438/738 |
| 2006/0231903 | A1 * | 10/2006 | Lee et al. | 257/377 |
| 2008/0296696 | A1 | 12/2008 | Yun et al. | |
| 2010/0237504 | A1 * | 9/2010 | Hong et al. | 257/758 |
| 2012/0122284 | A1 * | 5/2012 | Kim et al. | 438/287 |

FOREIGN PATENT DOCUMENTS

| KR | 1020000013433 | 3/2000 |
| KR | 1020000015465 | 3/2000 |

* cited by examiner

*Primary Examiner* — Calvin Lee
(74) *Attorney, Agent, or Firm* — Stanzione & Kim, LLP

(57) ABSTRACT

In a method of manufacturing a semiconductor device, a first etching mask and a second etching mask are formed sequentially on a metal gate structure on a substrate and a first insulating interlayer covering a sidewall of the metal gate structure respectively. An opening is formed to expose a top surface of the substrate by removing a portion of the first insulating interlayer not overlapped with the first etching mask or the second etching mask. A metal silicide pattern is formed on the exposed top surface of the substrate. A plug on the metal silicide pattern is formed to fill a remaining portion of the opening. Further, a planarization layer may be used as the second etching mask.

15 Claims, 15 Drawing Sheets

METHODS OF MANUFACTURING SEMICONDUCTOR DEVICE

CROSS-REFERENCE TO RELATED APPLICATIONS

This application claims priority from and the benefit under 35 USC §119 to Korean Patent Application No. 10-2010-0111971, filed on Nov. 11, 2010, in the Korean Intellectual Property Office (KIPO), the contents of which are herein incorporated by reference in their entirety.

BACKGROUND

1. Field

Exemplary embodiments relate to methods of manufacturing a semiconductor device having a metal gate electrode.

2. Discussion of the Background

Recently, methods of manufacturing a gate electrode using a metal have been developed. The metal gate electrode may be formed by a damascene process. As a semiconductor device having the metal gate electrode is formed, after forming the metal gate electrode, an ohmic layer may be formed by a silicidation process and a contact plug may be formed thereon. Thus, etching masks for performing such processes effectively are needed.

SUMMARY

Exemplary embodiments provide a method of manufacturing a semiconductor device using an etching mask for efficiently forming a contact plug.

Additional aspects and advantages of the present general inventive concept will be set forth in part in the description which follows and, in part, will be obvious from the description, or may be learned by practice of the general inventive concept.

Exemplary embodiments provide a method of manufacturing a semiconductor device, the method including: sequentially forming a first etching mask and a second etching mask on a metal gate structure, the metal gate structure being formed on a substrate, and a first insulating interlayer covering a sidewall of the metal gate structure, removing a portion of the first insulating interlayer that is not overlapped by the first etching mask or by the second etching mask to form an opening exposing a top surface of the substrate, forming a metal silicide pattern on the exposed top surface of the substrate, and forming a plug on the metal silicide pattern to fill a remaining portion of the opening.

In exemplary embodiments, when the first and the second etching mask are formed, a first hard mask layer may be formed on the metal gate structure and the first insulating interlayer, the first etching mask may be formed to expose a portion of the first insulating interlayer by patterning the first hard mask layer, a second insulating interlayer having a thickness substantially the same as or substantially similar to a thickness of the first etching mask may be formed on the exposed portion of the first insulating interlayer, and the second etching mask may be formed on the first etching mask and the second insulating interlayer In exemplary embodiments, when the opening is formed, a portion of the first insulating interlayer may be exposed by removing a portion of the second insulating interlayer not being covered by the second etching mask, and a portion of the exposed first insulating interlayer not being covered by the first etching mask may be removed.

In exemplary embodiments, the first hard mask layer may be formed using silicon nitride, and the second etching mask may be formed using a photoresist pattern.

In exemplary embodiments, when the first and the second etching mask are formed, the first hard mask layer and the second hard mask layer may be formed sequentially on the metal gate structure and the first insulating interlayer respectively, the first etching mask exposing a portion of the first hard mask layer may be formed by patterning the second hard mask layer, a planarization layer may be formed on the exposed portion of the first hard mask layer and the first etching mask, and the second etching mask exposing a portion of the first hard mask layer may be formed by patterning the planarization layer.

In exemplary embodiments, when the opening is formed, a portion of the first hard mask layer not being covered by the second etching mask may be removed.

In exemplary embodiments, the first hard mask layer and the second hard mask layer may be formed using silicon nitride and silicon oxide respectively, and the planarization layer may be formed using a spin-on-hard-mask (SOH).

In exemplary embodiments, the substrate may be divided into a field area having an isolation layer and an active region, the gate structure may be expanded to the first direction on the substrate, the first etching mask may be expanded to the first direction to cover the gate structure, the first etching mask may have a protrusion protruding to the second direction substantially perpendicular to the first direction, and the second etching mask may have an open area overlapping the active region and the protrusion of the first etching mask.

In exemplary embodiments, the substrate may be divided into a field area having an isolation layer and an active region, the gate structure may be expanded to a first direction on the substrate, the first etching mask may be expanded to the first direction to cover the gate structure, and the second etching mask may be expanded to a second direction substantially perpendicular to the first direction to include an open area overlapped with the active region.

In exemplary embodiments, the substrate may be divided into a field area having an isolation layer and an active region, the gate structure may be expanded to a first direction on the substrate, the first etching mask may be expanded to the first direction to cover the gate structure, the first etching mask may have a protrusion protruding to a second direction substantially perpendicular to the first direction and a recess corresponding to the protrusion, the gate structure may be not be covered by the first etching mask at the recess, the second etching mask may be expanded to the second direction, and the second etching mask may include an open area being partially overlapped with the protrusion and the recess of the first etching mask.

In exemplary embodiments, the plug may contact a top surface of the gate structure directly.

In exemplary embodiments, after forming the metal silicide pattern, a spacer may be formed on an inner wall of the opening.

In exemplary embodiments, an upper portion of the substrate adjoining the gate structure may have an impurity region, and the opening may expose a portion of a top surface of the impurity region.

In exemplary embodiments, an elevated source drain (ESD) layer may be formed on the exposed portion of the top surface of the impurity region.

In exemplary embodiments, a gate spacer may be formed on the sidewall of the metal gate structure.

In exemplary embodiments, the plug may be formed self-aligned with the gate spacer and the first etching mask.

Exemplary embodiments provide a method of manufacturing a semiconductor device, the method including: forming an etching mask on a metal gate structure and a first insulating interlayer, the metal gate structure being formed on a substrate, and the first insulating interlayer covering a sidewall of the metal gate structure, removing a portion of the first insulating interlayer that is not covered by the etching mask to form a first opening exposing a top surface of the substrate, forming a metal silicide pattern on the exposed top surface of the substrate, forming a planarization layer on the metal silicide pattern and the etching mask to fill a remaining portion of the first opening, patterning the planarization layer to form a second opening exposing a portion of the metal silicide pattern, and forming a plug on the metal silicide pattern to fill a remaining portion of the second opening.

In exemplary embodiments, the etching mask may be formed using silicon nitride, and the planarization layer is formed using a spin-on-hard-mask (SOH).

In exemplary embodiments, the substrate may be divided into a field area having an isolation layer and an active region, the gate structure may be expanded to the first direction on the substrate, and the metal silicide pattern may be formed on the active region.

In exemplary embodiments, before forming the plug, a spacer may be formed on an inner wall of the second opening.

Exemplary embodiments provide a method of manufacturing a semiconductor device, the method including forming a metal silicide pattern on a substrate, the metal silicide pattern being formed between metal gate structures disposed on the substrate and being formed according to a first mask; and forming a plug on at least portions of the metal silicide pattern according to a second mask.

Exemplary embodiments provide a metal silicide pattern and a plug that may be formed using a first etching mask and a second etching mask and may be formed to self-align with gate structures. Herein, the first etching mask may cover the gate structures, and the second etching mask may include an open area exposing an active region and/or the first etching mask. Therefore, using the first etching mask and the second etching mask, an opening may be formed simply and efficiently to form the metal silicide pattern and the plug.

BRIEF DESCRIPTION OF THE DRAWINGS

Exemplary embodiments will be more clearly understood from the following detailed description taken in conjunction with the accompanying drawings.

Figure 1:
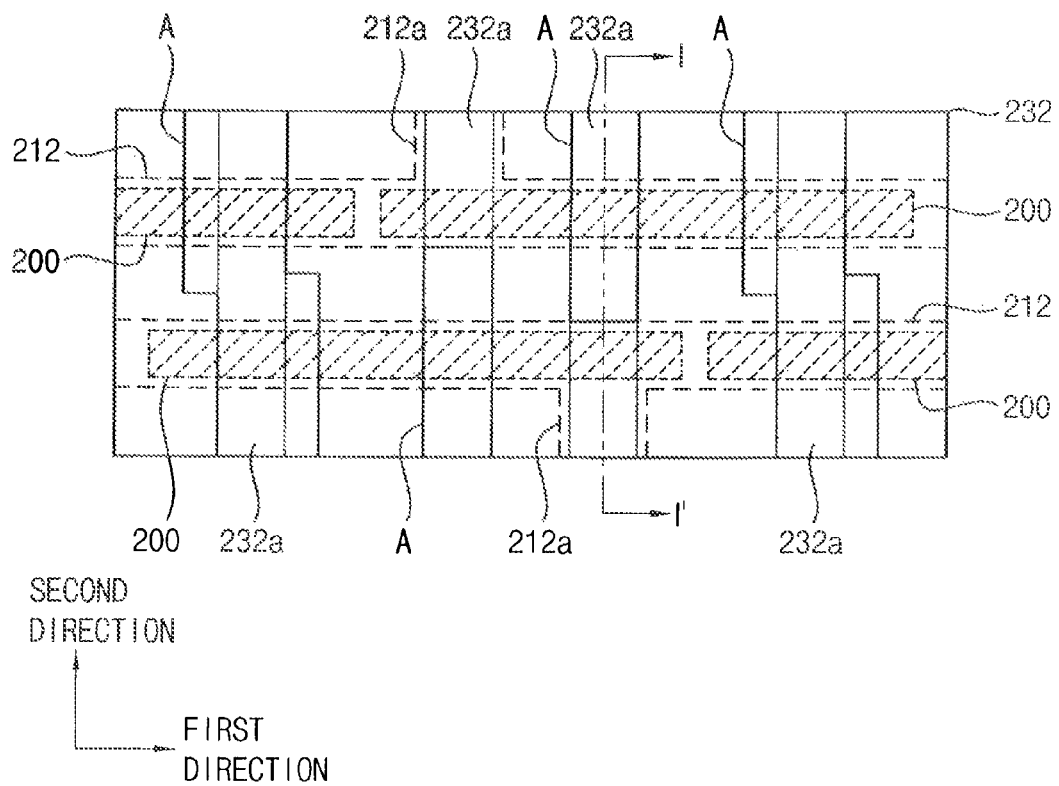
FIGS. 1 to 29 represent non-limiting, exemplary embodiments as described herein.
Figure 13:
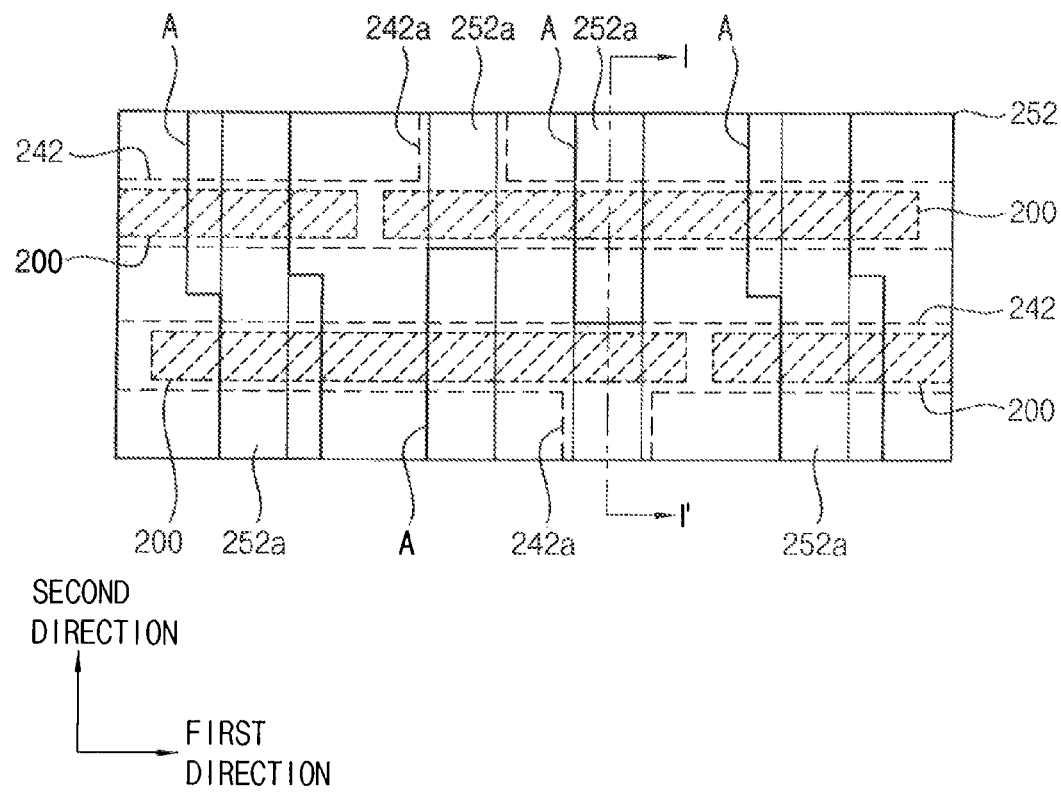
Figure 19:
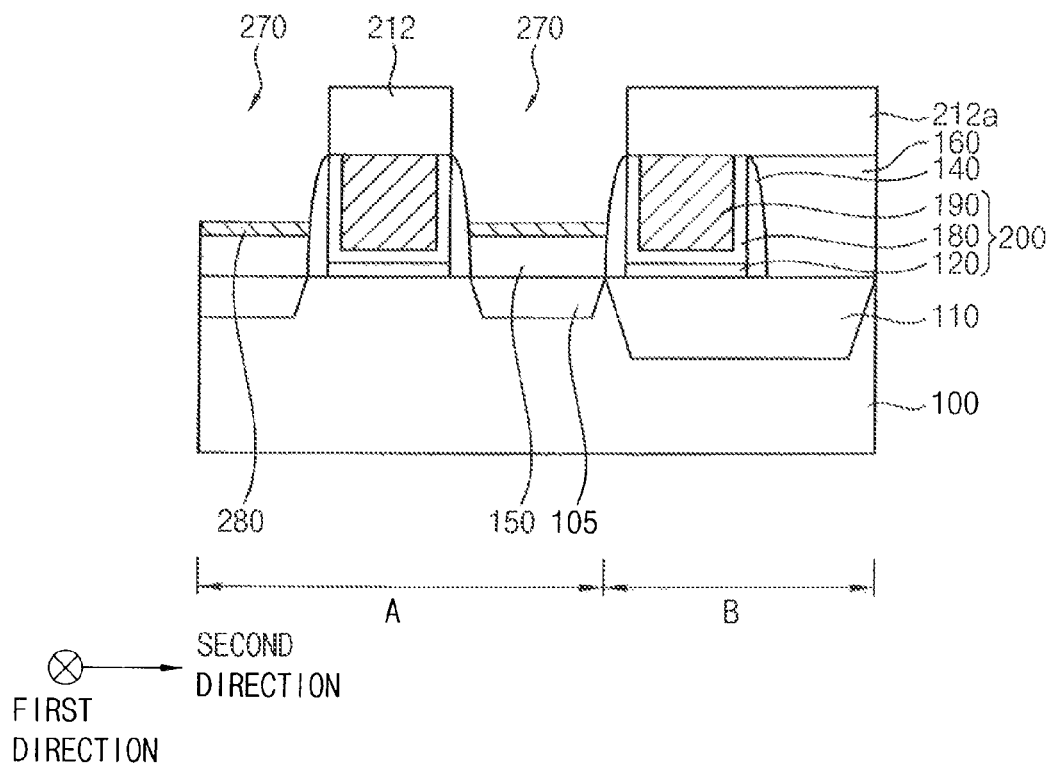
Figure 20:
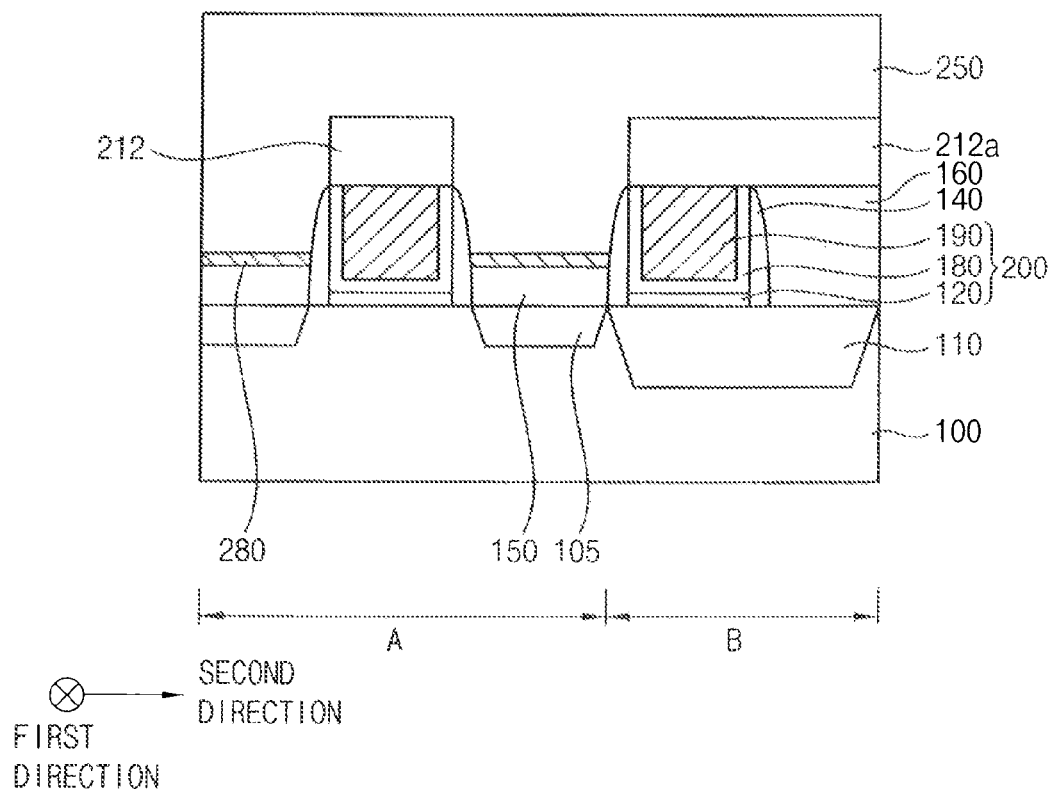
Figure 21:
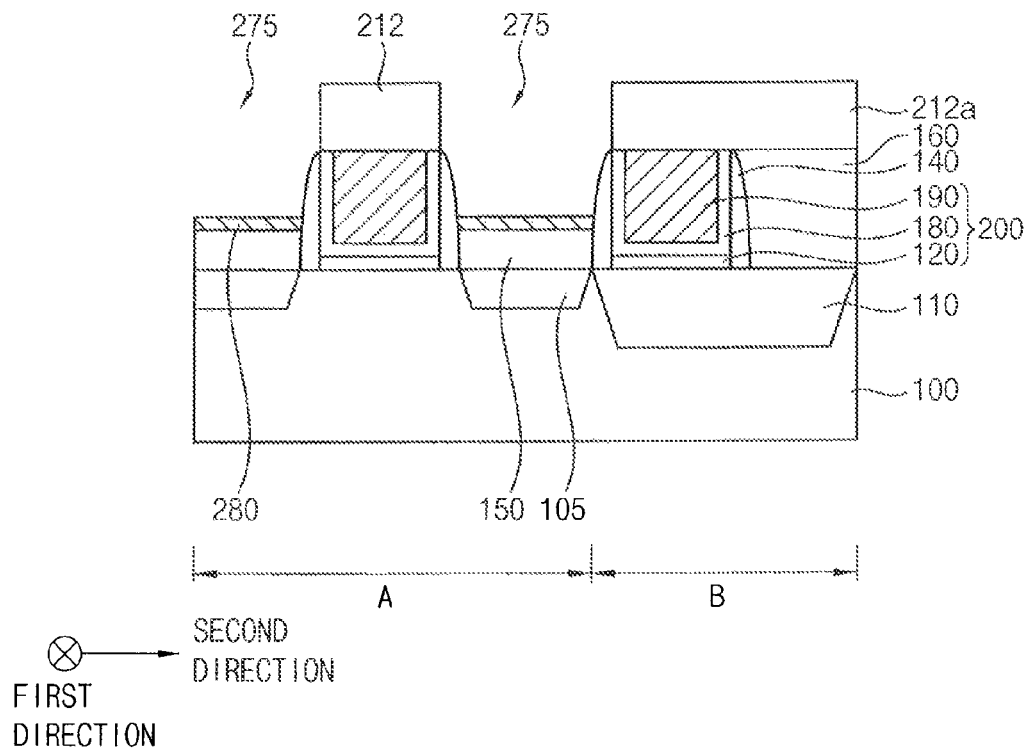
Figure 22:
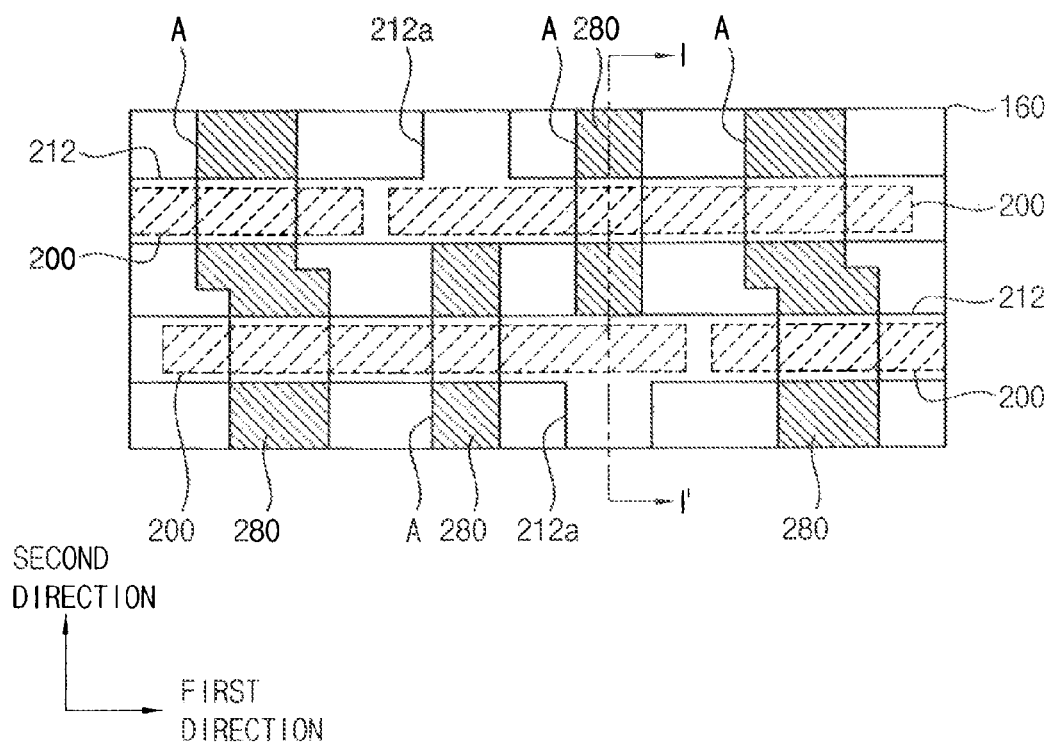
Figure 23:
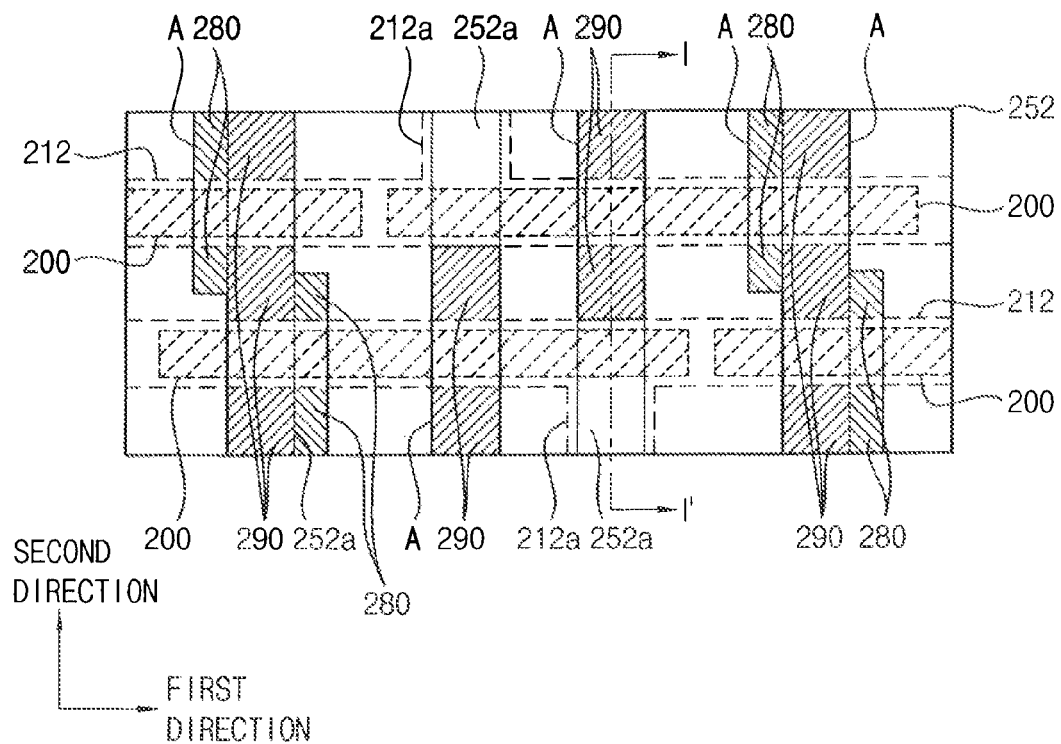
Figure 24:
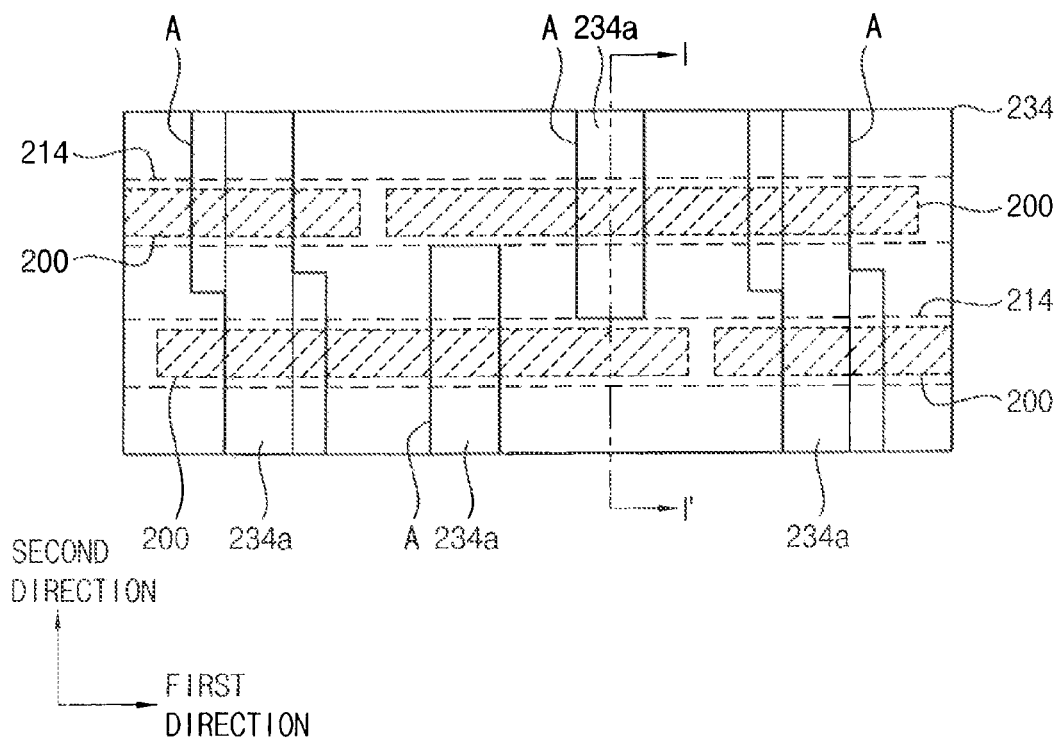
Figure 25:
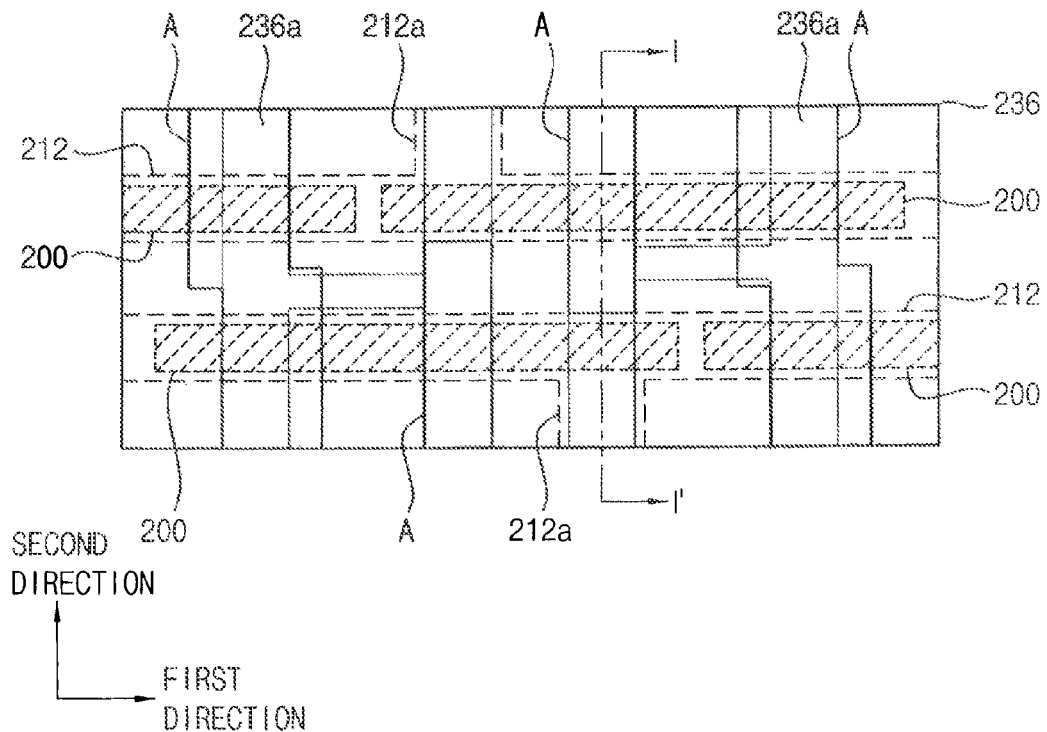
Figure 26:
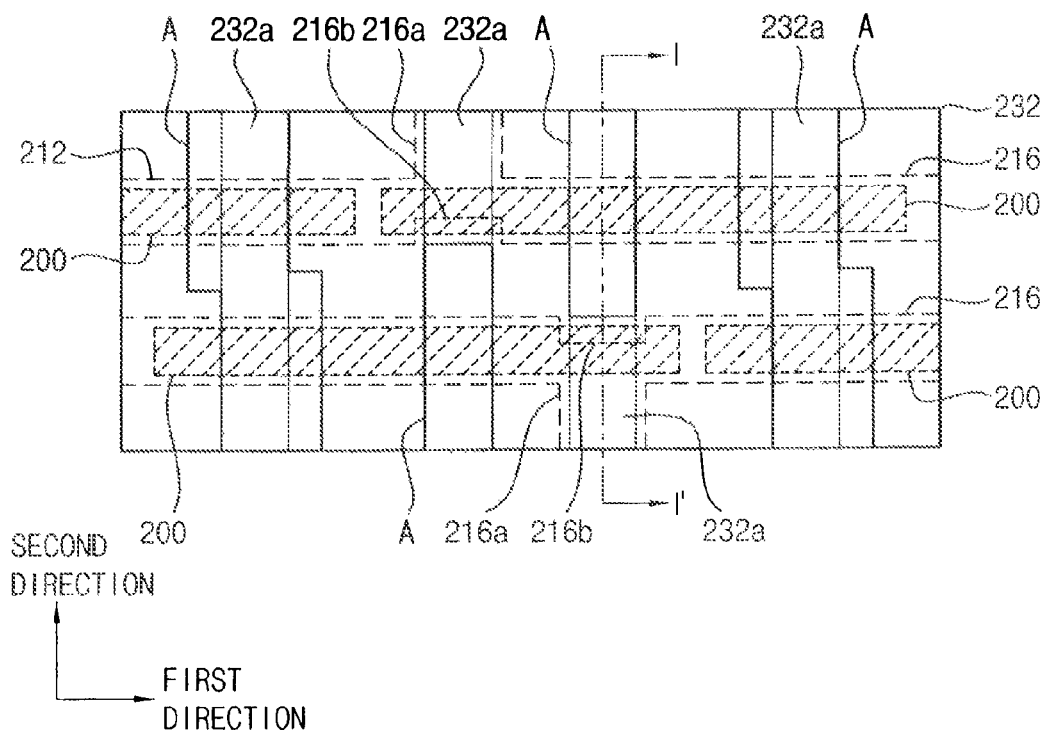
Figure 27:
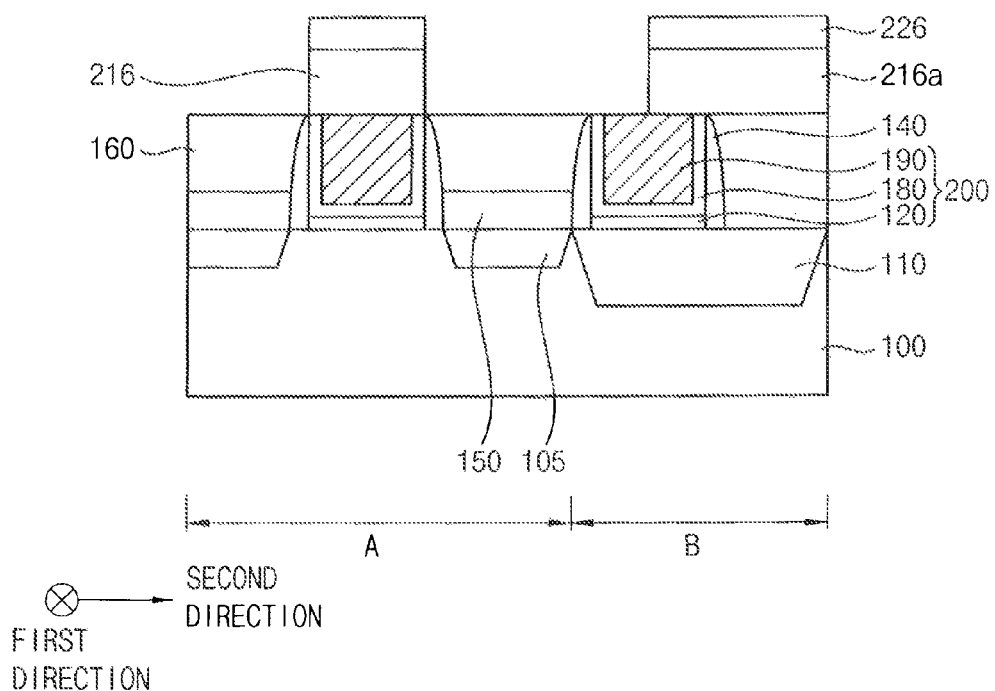
Figure 28:
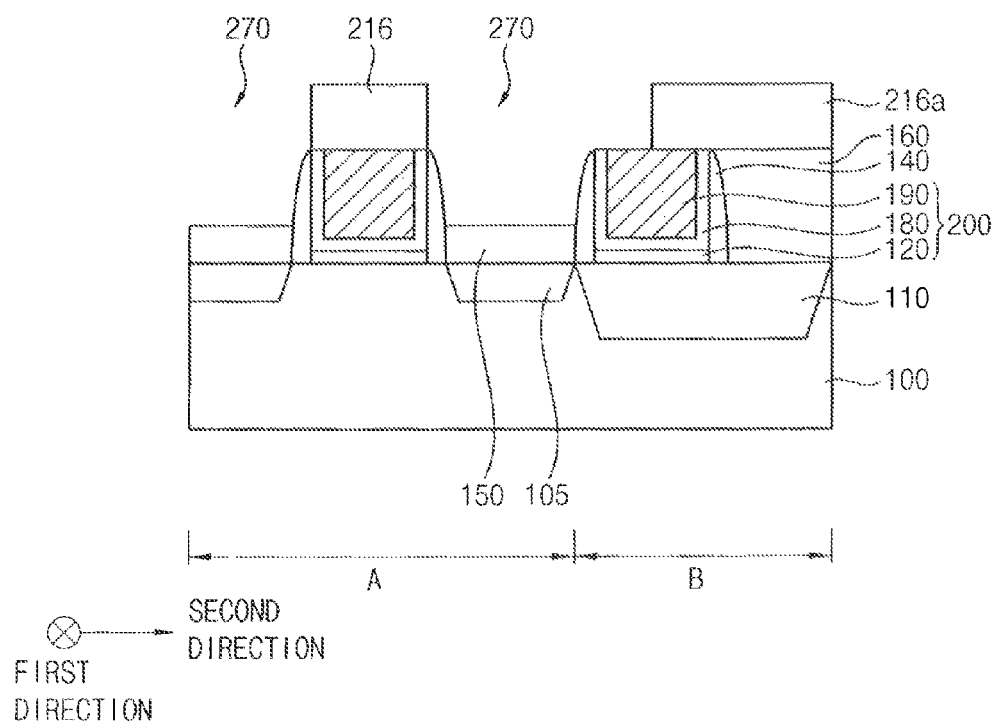
Figure 29:
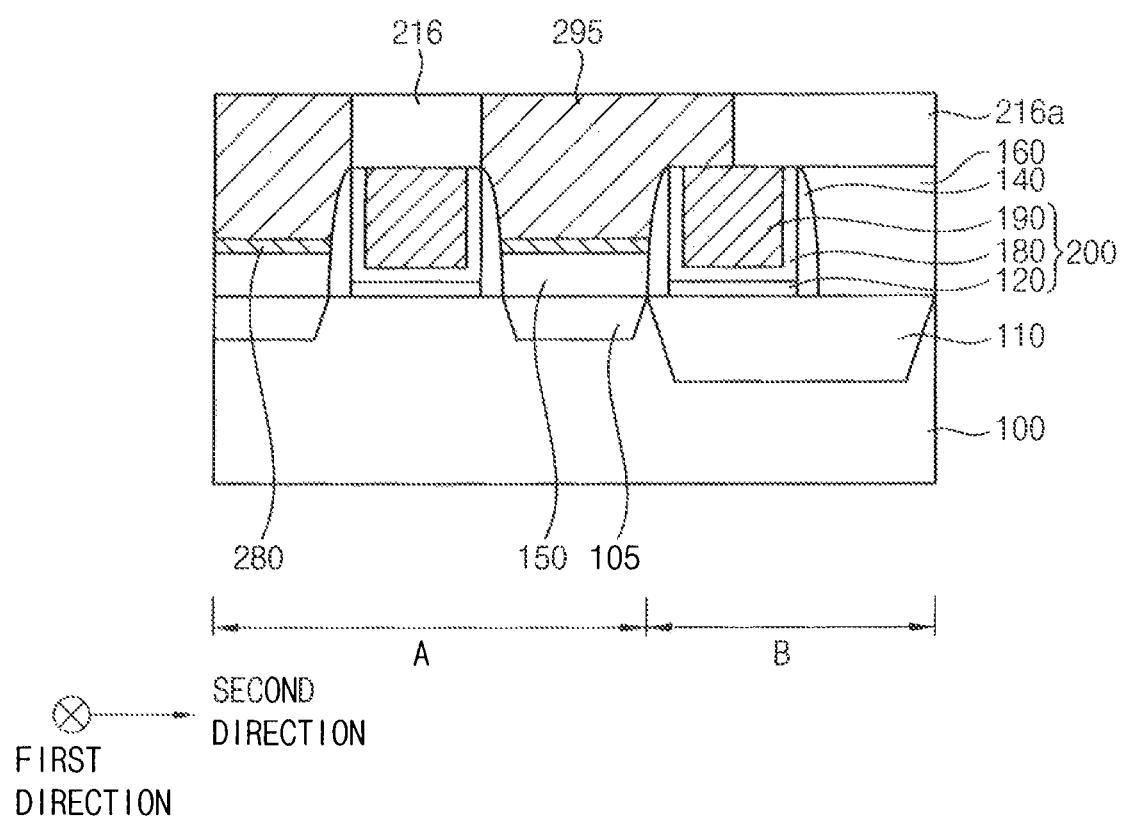

These and/or other aspects and advantages of the present general inventive concept will become apparent and more readily appreciated from the following description of the embodiments, taken in conjunction with the accompanying drawings of which:

FIG. 1 is a top view illustrating layouts of first and second etching masks used in methods of manufacturing a semiconductor device according to exemplary embodiments;

FIGS. 2 to 12 are cross-sectional views illustrating methods of manufacturing a semiconductor device according to exemplary embodiments;

FIG. 13 is a top view illustrating layouts of first and a second etching masks used in a method of manufacturing a semiconductor device according to exemplary embodiments;

FIGS. 14 to 18 are cross-sectional views illustrating methods of manufacturing a semiconductor device according to exemplary embodiments;

FIGS. 19 to 21 are cross-sectional views illustrating methods of manufacturing a semiconductor device according to exemplary embodiments;

FIGS. 22 to 23 are top views illustrating layouts of first and second etching masks used in methods of manufacturing semiconductor devices according to exemplary embodiments;

FIGS. 24 to 26 are top views illustrating layouts of first and second etching masks used in methods of manufacturing a semiconductor device according to exemplary embodiments; and FIGS. 27 to 29 are cross-sectional views illustrating methods of manufacturing a semiconductor device according to exemplary embodiments.

DETAILED DESCRIPTION OF THE ILLUSTRATED EMBODIMENTS

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept while referring to the figures. In the drawings, the sizes and relative sizes of layers and regions may be exaggerated for clarity.

It will be understood that when an element or layer is referred to as being "on," "disposed on," "connected to," or "coupled to" another element or layer, it can be directly on, disposed on, connected to, or coupled to the other element or layer or intervening elements or layers may be present. In contrast, when an element is referred to as being "directly on," "disposed directly on," "directly connected to," or "directly coupled to" another element or layer, there are no intervening elements or layers present. As used herein, the term "and/or" includes any and all combinations of one or more of the associated listed items, including only one of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device, unless otherwise stated, and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

Figure 2:
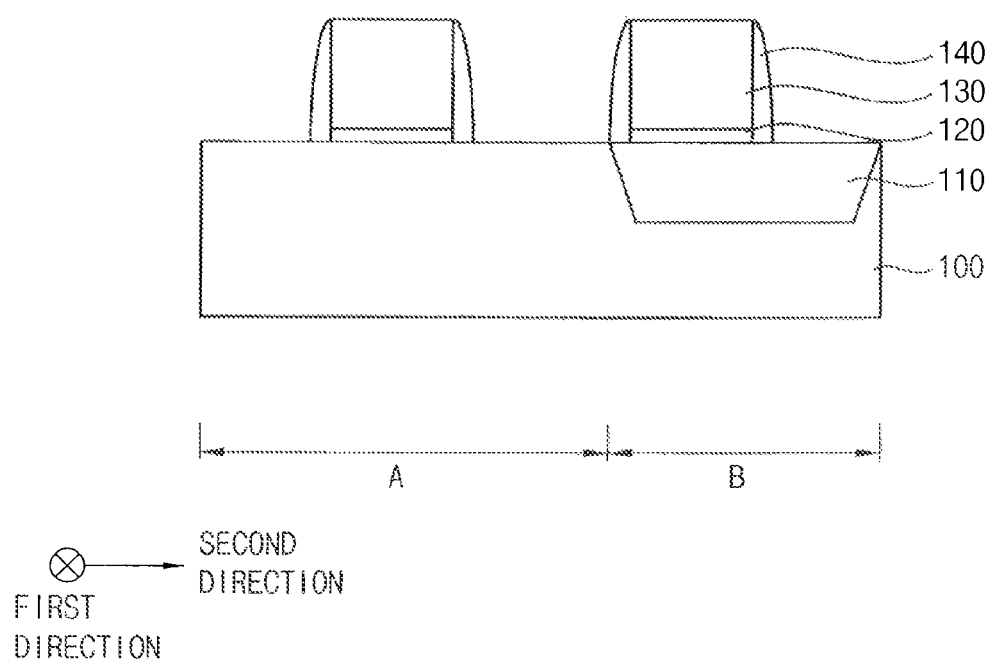

FIG. 1 is a top view illustrating a layout of first and second etching masks used in a method of manufacturing a semiconductor device according to exemplary embodiments. FIGS. 2 to 12 are cross-sectional views of the semiconductor device of FIG. 1 cut along the line I-I' illustrating methods of manufacturing the semiconductor device according to exemplary embodiments. Referring to FIGS. 1 and 2, after forming an isolation layer 110 on a substrate 100, dummy gate structures and gate spacers 140 may be formed on the substrate 100 and the isolation layer 110.

The substrate 100 may include a semiconductor substrate, e.g., a silicon substrate, a germanium substrate, a silicon-germanium substrate, a silicon-on-insulator (SOI) substrate, a germanium-on-insulator (GOI) substrate, and the like. The substrate 100 may be divided into a first region A and a second region B by the isolation layer 110. That is, the first region A in which the isolation layer 110 is not formed may be defined as an active region, and the second region B in which the isolation layer 110 is formed may be defined as a field region. In exemplary embodiments, the active region A may have a linear shape or a bar shape extending in a second direction substantially parallel to a top surface of the substrate 100. In exemplary embodiments, the isolation layer 110 may be formed by a shallow trench isolation (STI) process.

Each of the dummy gate structures may be formed by sequentially stacking a dielectric layer pattern 120 and a dummy gate electrode 130 on the substrate 100. The dielectric layer pattern 120 may be formed of a material having a low dielectric constant and may be, for example, a low-k dielectric layer pattern. Although aspects are not limited thereto, the dielectric layer pattern 120 will be referred to hereinafter as the low-k dielectric layer pattern 120.

Particularly, a low-k dielectric layer and a dummy gate electrode layer may be formed sequentially on the substrate 100 having the isolation layer 110 thereon. In exemplary embodiments, the low-k dielectric layer may be formed on the substrate 100 and the isolation layer 110 by a chemical vapor deposition (CVD) process using silicon oxide ($SiO_2$). The dummy gate electrode layer may be formed on the low-k dielectric layer by a CVD process using polysilicon, amorphous silicon, etc. By an etching process using a hard mask (not illustrated) or a photoresist pattern (not illustrated) as an etching mask, the dummy gate electrode layer and the low-k dielectric layer may be patterned. Thus, the dummy gate structures, each of which may include the low-k dielectric layer pattern 120 and the dummy gate electrode 130 sequentially stacked on the substrate 100 and the isolation layer 110, may be formed. In exemplary embodiments, each of the dummy gate structures may extend in a first direction substantially parallel to the top surface of the substrate 100 and substantially perpendicular to the second direction.

After forming a spacer layer covering the dummy gate structures on the substrate 100 and the isolation layer 110 using silicon nitride or silicon oxide, the spacer layer may be patterned by an anisotropic etching process to form gate spacers 140 on sidewalls of the dummy gate structures.

Figure 3:
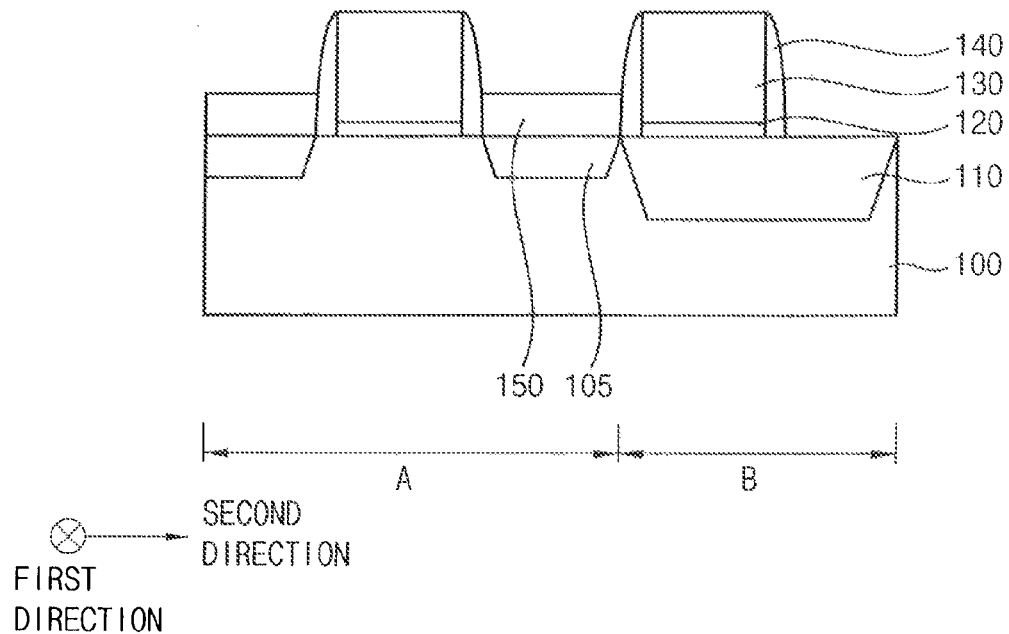

Referring to FIG. 3, impurity regions 105 may be formed at upper portions of the substrate 100 adjacent to and/or between the dummy gate structures, and elevated source drain (ESD) layers 150 may be formed on the impurity regions 105.

Particularly, an upper portion of the active region A may be removed using the dummy gate structures and the gate spacers 140 as an etching mask to form a trench (not illustrated), and the impurity regions 105 may be formed to fill the trench.

In exemplary embodiments, the impurity regions 105 may be formed by a first selective epitaxial growth (SEG) process using top surfaces of the substrate 100 exposed by the trench as a seed layer. In exemplary embodiments, in the first SEG process, a CVD process may be performed at a temperature of about 500° C. to about 900° C. under a pressure of about 0.1 torr to about atmospheric pressure.

The CVD process may be performed using a source gas, for example, dichlorosilane ($SiH_2Cl_2$) gas, germane ($GeH_4$) gas, etc. Thus, a single crystalline silicon-germanium (SiGe) layer may be formed. While the CVD process is performed, a p-type impurity source gas, for example, diborane ($B_2H_6$) gas, may be also used, so that the single crystalline SiGe layer may be doped with impurities.

The CVD process may be performed using a source gas, for example, disilane ($Si_2H_6$) gas, methylsilane ($SiH_3CH_3$) gas, etc. Thus, a single crystalline silicon carbide (SiC) layer may be formed. While the CVD process is performed, an n-type impurity source gas, for example, phosphine ($PH_3$) gas, may be also used, so that the single crystalline SiC layer may be doped with impurities.

The ESD layers 150 may be formed on the impurity regions 105 by a second SEG process. The second SEG process may be performed using the impurity regions 105 as a seed layer. In exemplary embodiments, in the second SEG process, a CVD process may be performed at a temperature of about 500° C. to about 900° C. under a pressure of about 0.1 torr to about atmospheric pressure. The CVD process may be performed using a source gas, such as $SiH_2Cl_2$ gas, and a p-type impurity source gas, such as diborane ($B_2H_6$) gas. Thus, a single crystalline silicon layer doped with p-type impurities may be formed. Instead of the p-type impurity source gas, the CVD process may be performed using an n-type impurity source gas, such as $PH_3$ gas. Thus, a single crystalline silicon layer doped with n-type impurities may be formed.

In exemplary embodiments, the first SEG process forming the impurity regions 105 and the second SEG process forming the ESD layers 150 may be performed in-situ. That is, after providing a silicon source gas, a germanium source gas, and a p-type impurity source gas to form the impurity regions 105, the provision of the germanium source gas may be stopped to form the ESD layers 150. Also, after providing a silicon source gas, a carbon source gas, and an n-type impurity source gas to form the impurity regions 105, the provision of the carbon source gas may be stopped to form the ESD layers 150.

However, aspects are not limited thereto such that the process for forming the ESD layers 150 need not be performed.

Figure 4:
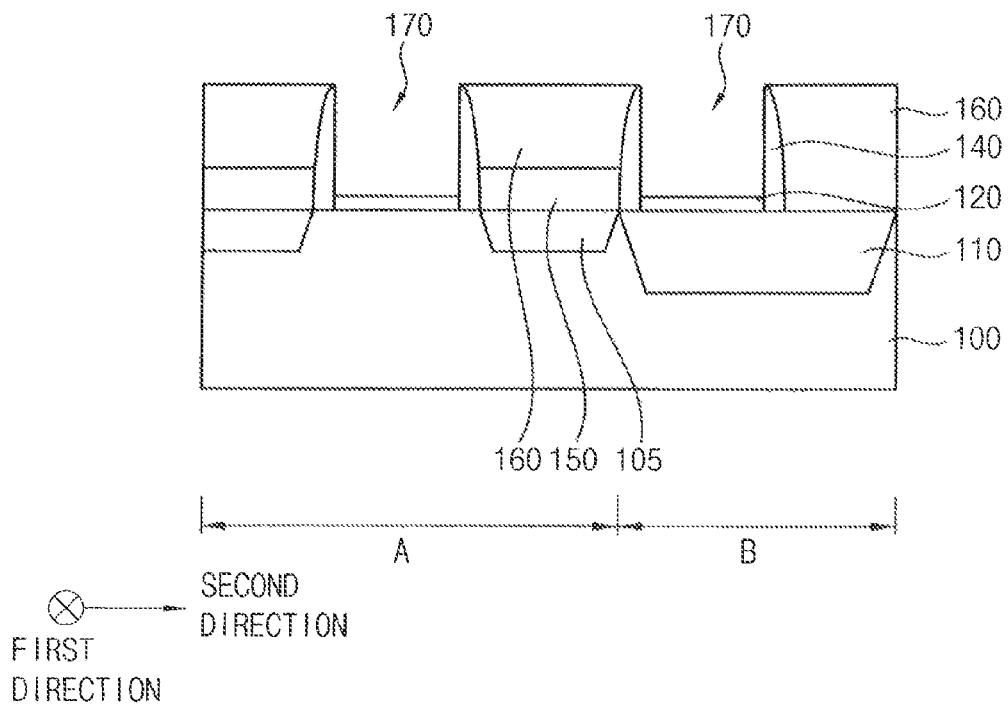

Referring to FIG. 4, a first insulating interlayer 160 disposed on the dummy gate structures and the gate spacers 140 may be formed on the substrate 100, the isolation layer 110, and the ESD layers 150. In exemplary embodiments, the first insulating interlayer 160 may be formed using silicon oxide, and the first insulating interlayer 160 may be formed to completely or partially cover the dummy gate structures and the gate spacers 140 and/or a sidewall thereof. An upper portion of the first insulating interlayer 160 may be planarized until the dummy gate electrode 130 is exposed. In exemplary embodiments, the planarization process may be performed by a chemical mechanical polishing (CMP) process.

The exposed dummy gate electrode 130 may be removed to form a recess 170, and the low-k dielectric layer pattern 120 may be exposed. The dummy gate electrode 130 may be removed by a wet etching process or a dry etching process.

Figure 5:
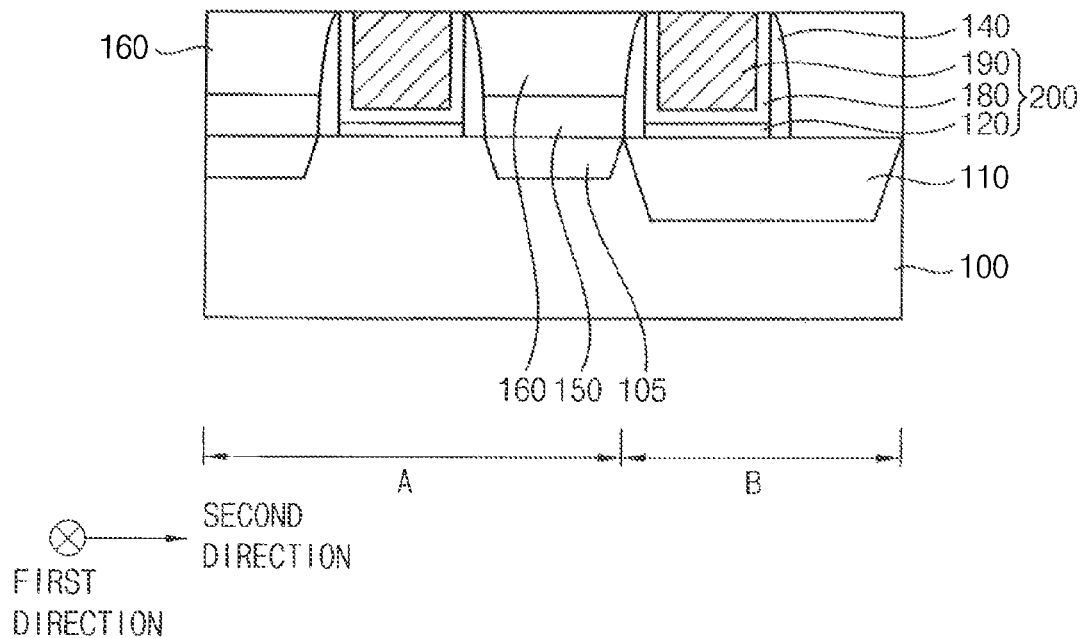

Referring to FIGS. 1 and 5, a dielectric layer may be formed on an inner wall of the recess 170 and the first insulating interlayer 160 to form a dielectric layer pattern 180. The dielectric layer pattern 180 may be formed of a material having a high dielectric constant and may be, for example, a high-k dielectric layer. Although aspects are not limited thereto, the dielectric layer pattern 180 will be referred to hereinafter as the high-k dielectric layer pattern 180. A gate electrode layer may be formed on the high-k dielectric layer to form a gate electrode 190 to sufficiently fill a remaining portion of the recess 170.

The high-k dielectric layer may be formed using a metal oxide. The metal oxide may include hafnium oxide ($HfO_2$), tantalum pentoxide ($Ta_2O_5$), zirconium dioxide ($ZrO_2$), etc. The gate electrode layer may be formed using a metal, for example, aluminum (Al), tungsten (W) or titanium nitride (TiN), a metal nitride and/or a metal silicide by an atomic layer deposition (ALD) process, a physical vapor deposition (PVD) process, etc. Additionally, a heat treatment process, for example, a rapid thermal annealing (RTA) process, a spike-RTA process, a flash RTA process or a laser annealing process may be performed on the gate electrode layer.

Upper portions of the gate electrode layer and the high-k dielectric layer may be planarized until the first insulating interlayer 160 is exposed, so that the high-k dielectric layer pattern 180 may be formed on the inner wall of the recess 170, and the gate electrode 190 filling the remaining portion of the recess 170 may be formed on the high-k dielectric layer pattern 180. In exemplary embodiments, the planarization process may be performed by a CMP process.

Thus, gate structures 200, each of which includes the low-k dielectric layer pattern 120, the high-k dielectric layer pattern 180, and the gate electrode 190 may be formed on the substrate 200. The gate structures, as used herein, e.g., gate structures 200, may be referred to as metal gate structures. The gate spacers 140 may be formed on sidewalls of the gate structures 200. The low-k dielectric layer pattern 120 together with the high-k dielectric layer pattern 180 may serve as a gate insulation layer pattern. Each of the gate structures 200, the adjacent impurity regions 105, and the ESD layers 150 may define a transistor.

In exemplary embodiments, the semiconductor device may be a static random access memory (SRAM) device, and a unit cell of the SRAM device may have two drive transistors, two load transistors, and two access transistors.

Figure 6:
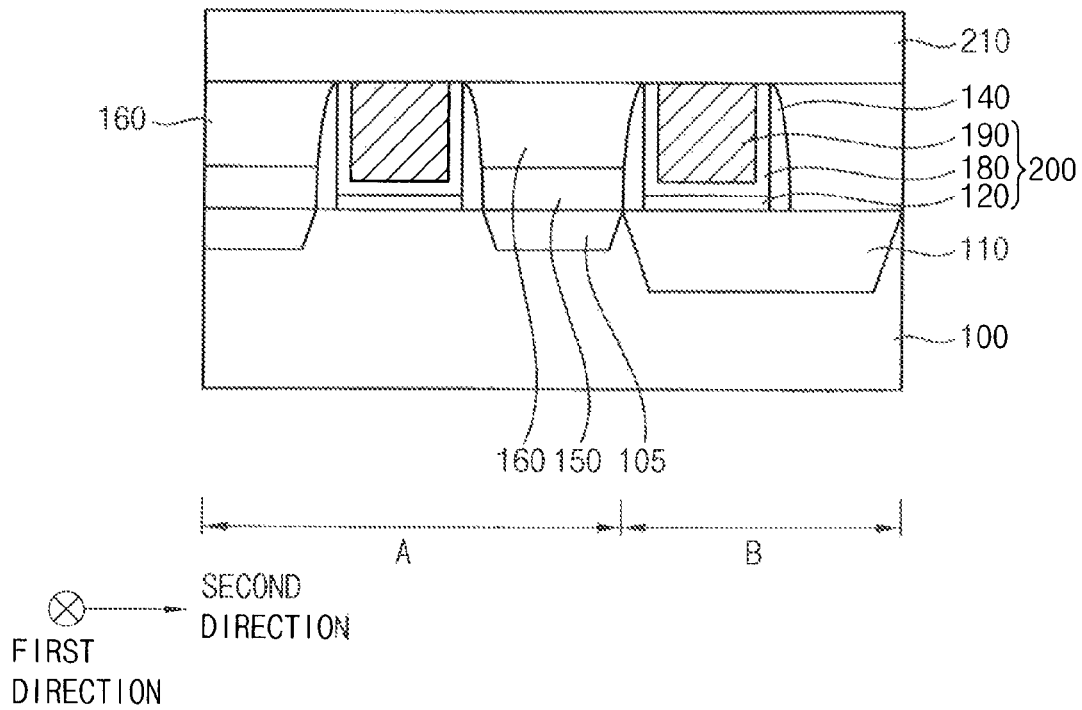

Referring to FIG. 6, a first hard mask layer 210 may be formed on the gate structures 200, and the gate spacers 140, and the first insulating interlayer 160. In exemplary embodiments, the first hard mask layer 210 may be formed using silicon nitride.

Figure 7:
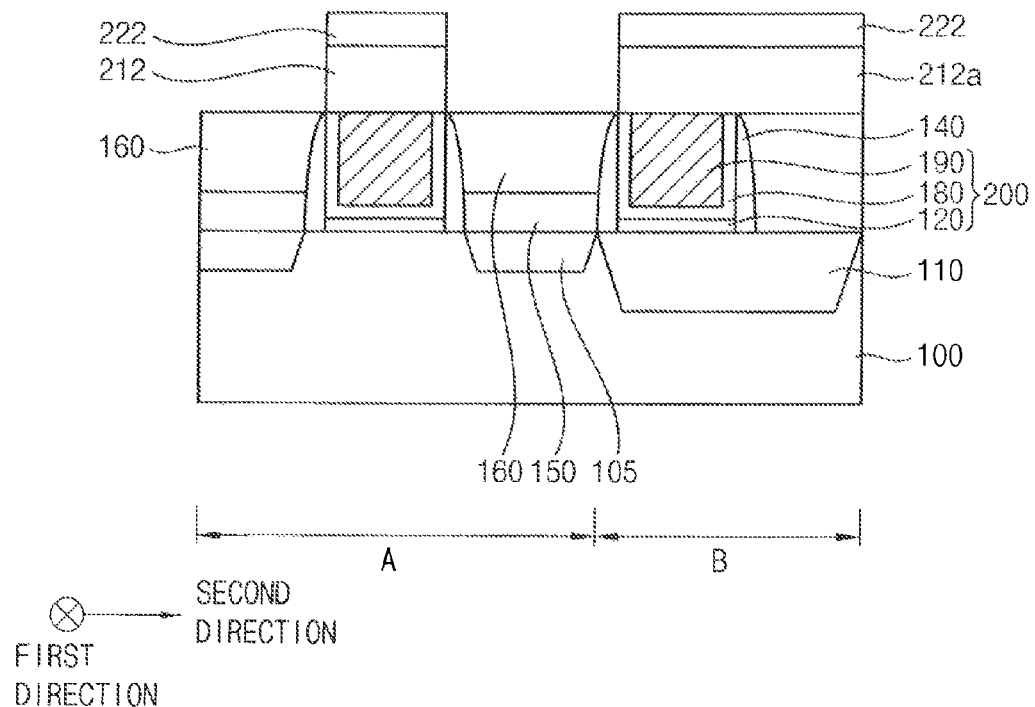

Referring to FIGS. 1 and 7, a photoresist pattern 222 may be formed on the first hard mask layer 210. The first hard mask layer 210 may be patterned using the photoresist pattern 222 to form a first etching mask 212, and a top surface of the first insulating interlayer 160 may be exposed. In exemplary embodiments, the first etching mask 212 may extend in the first direction to cover the gate structures 200, and may include a protrusion 212a protruding along the second direction, for example, to cover the second region B or the field region B. Although the protrusion 212a is shown to protrude squarely or at right angles from the first etching mask 212, aspects need not be limited thereto such that the protrusions 212a may have another shape, for example, partially circular, and/or elliptical.

Figure 8:
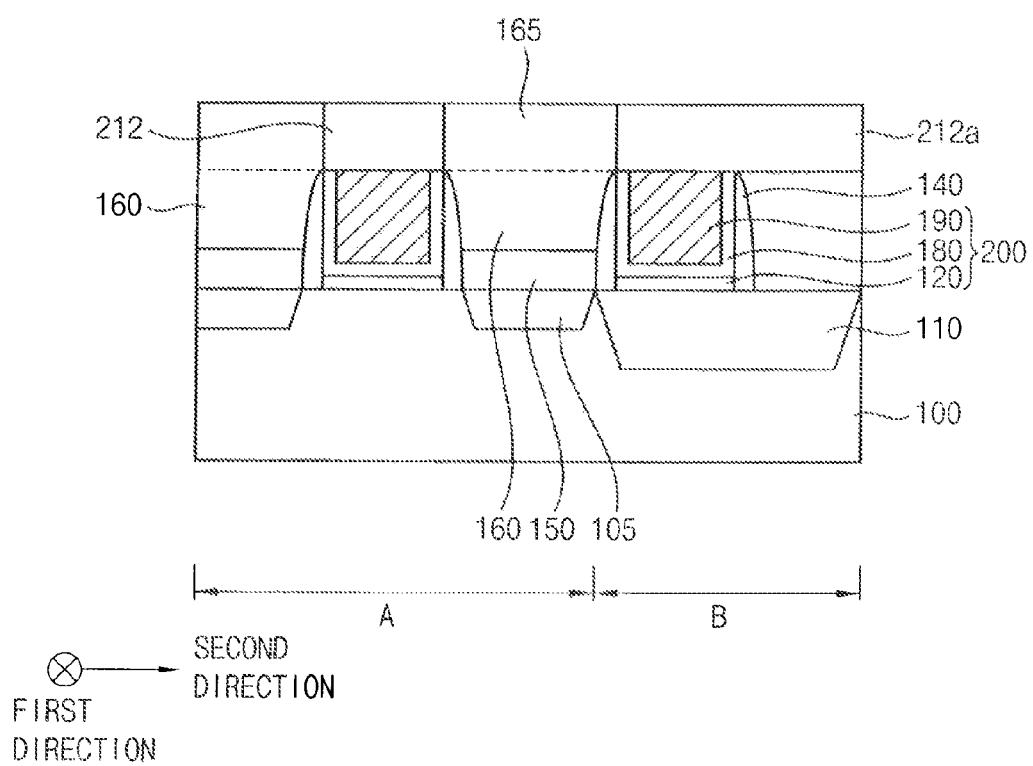

Referring to FIG. 8, after removing the photoresist pattern 222, a second insulating interlayer 165 may be formed on the exposed top surface of the first insulating interlayer 160. Particularly, an insulation layer may be formed on the exposed top surface of the first insulating interlayer 160 and the first etching mask 212 to a sufficient thickness. Additionally, an upper portion of the insulation layer may be planarized until the first etching mask 212 is exposed to form the second insulating interlayer 165. Thus, the second insulating interlayer 165 may have a height substantially the same as or very similar to that of the first etching mask 212. In exemplary embodiments, the second insulating interlayer 165 may be formed using a material substantially the same as that of the first insulating interlayer 160, for example, silicon oxide. Thus, the second insulating interlayer 165 may be merged with the first insulating interlayer 160.

The planarization process on the insulation layer may be terminated before exposing the first etching mask 212. In such case, a portion of the second insulating interlayer 165 may remain on the first insulating interlayer 160 and on the first etching mask 212.

Figure 9:
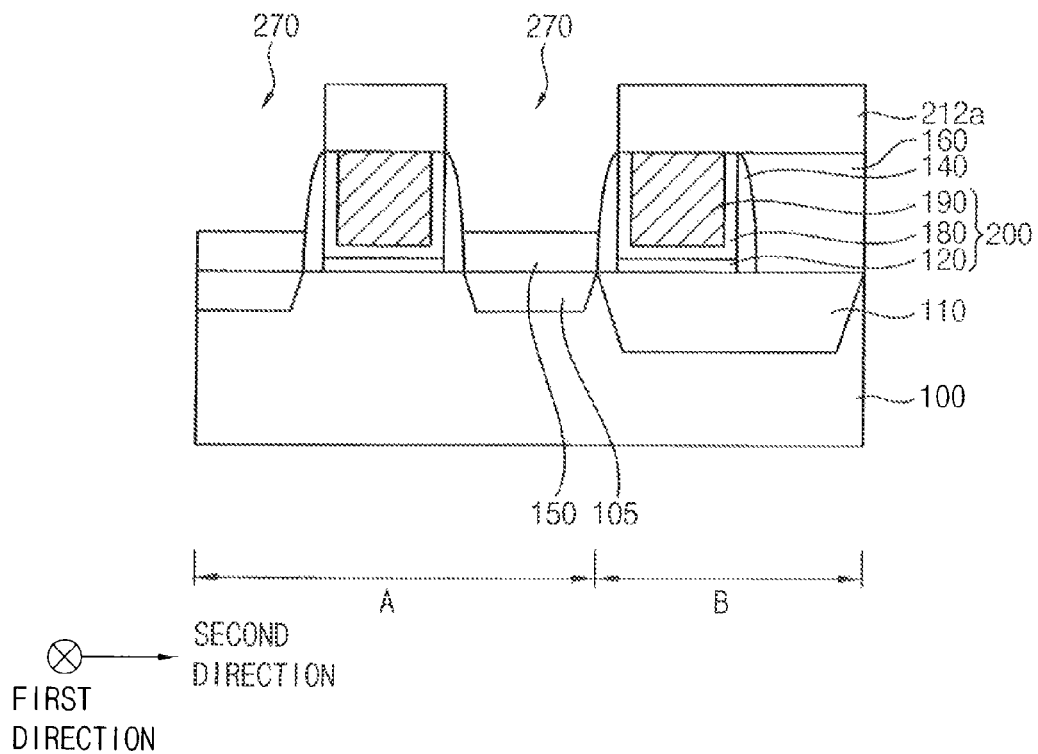

Referring to FIGS. 1 and 9, a second etching mask 232 may be formed on the first etching mask 212 and the second insulating interlayer 165. In exemplary embodiments, the second etching mask 232 may be formed using a photoresist pattern or a hard mask. The second etching mask 232 may include an open area 232a that extends in the second direction and overlaps the active region A and the protrusion 212a of the first etching mask 212. The second etching mask 232 is not seen in FIG. 9 as the cross-section I-I' along which FIG. 9 is taken is in the open area 232a of the second etching mask 232 as shown in FIG. 1.

Portions of the first and the second insulating interlayers 160 and 165 that are not overlapped by the first etching mask 212 or the second etching mask 232 may be removed to form a first opening 270 exposing the ESD layer 150. In exemplary embodiments, a portion of the second insulating interlayer 165 exposed by the open area 232a of the second etching mask 232 may be removed, and a portion of the first insulating interlayer 160 not covered by the first etching mask 212 may be removed. Thus, portions of the first and the second insulating interlayers 160 and 165 that are not overlapped by the first etching mask 212 or by the second etching masks 232 may be removed to form the first opening 270. In this case, the first opening 270 may be formed self-aligned with or disposed between the first etching mask 212 and the gate spacers 140.

The open area 232a of the second etching mask 232 may expose only the active region A and/or the protrusion 212a of the first etching mask 212, and the first etching mask 212 may cover the gate structures 200, and thus the first opening 270 may be formed only on the ESD layers 150 between the gate structures 200. As a result, a silicidation process or a plug formation process may be performed effectively only in a desired area.

Figure 10:
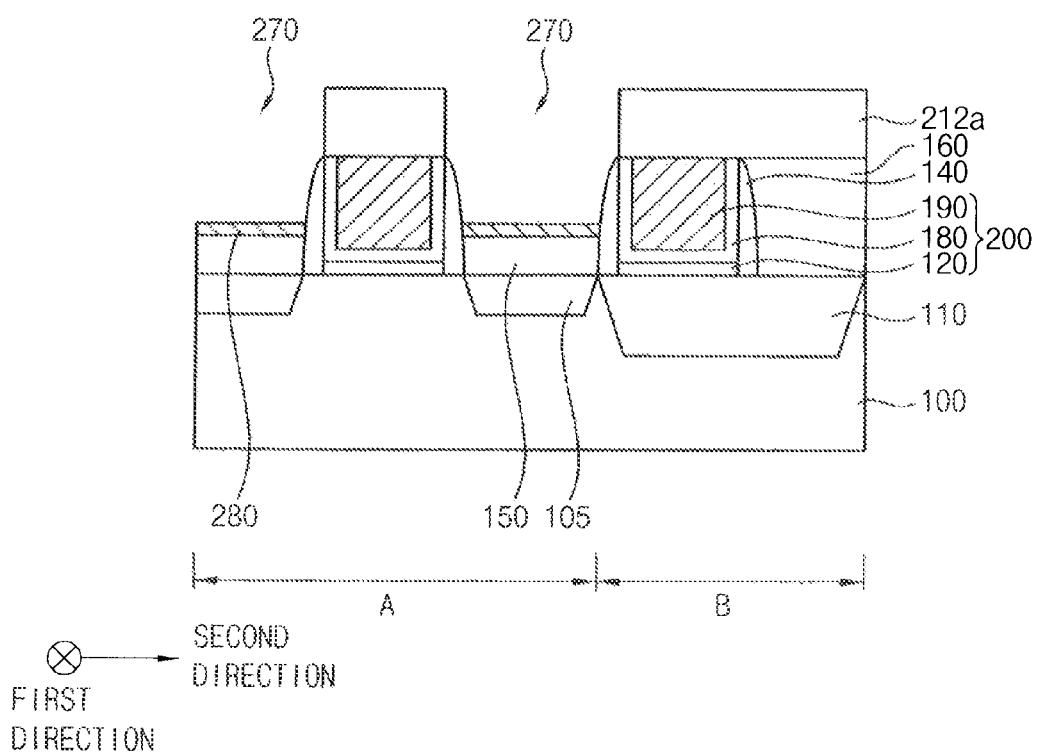

Referring to FIGS. 1 and 10, after removing the second etching mask 232, a metal silicide pattern 280 may be formed on the exposed portions of the ESD layers 150 in the first opening 270. Particularly, a metal layer may be formed on the ESD layers 150, the gate spacers 140, and the first etching mask 212, and heat treated to form a metal silicide layer on the ESD layers 150 having silicon. A portion of the metal layer not reacted with silicon of the ESD layers 150 may be removed to form a metal silicide pattern 280 on the ESD layers 150. In exemplary embodiments, the metal layer may be formed using Ni, Pt, etc., and the metal silicide pattern 280 may include nickel silicide, platinum silicide, etc.

Figure 11:
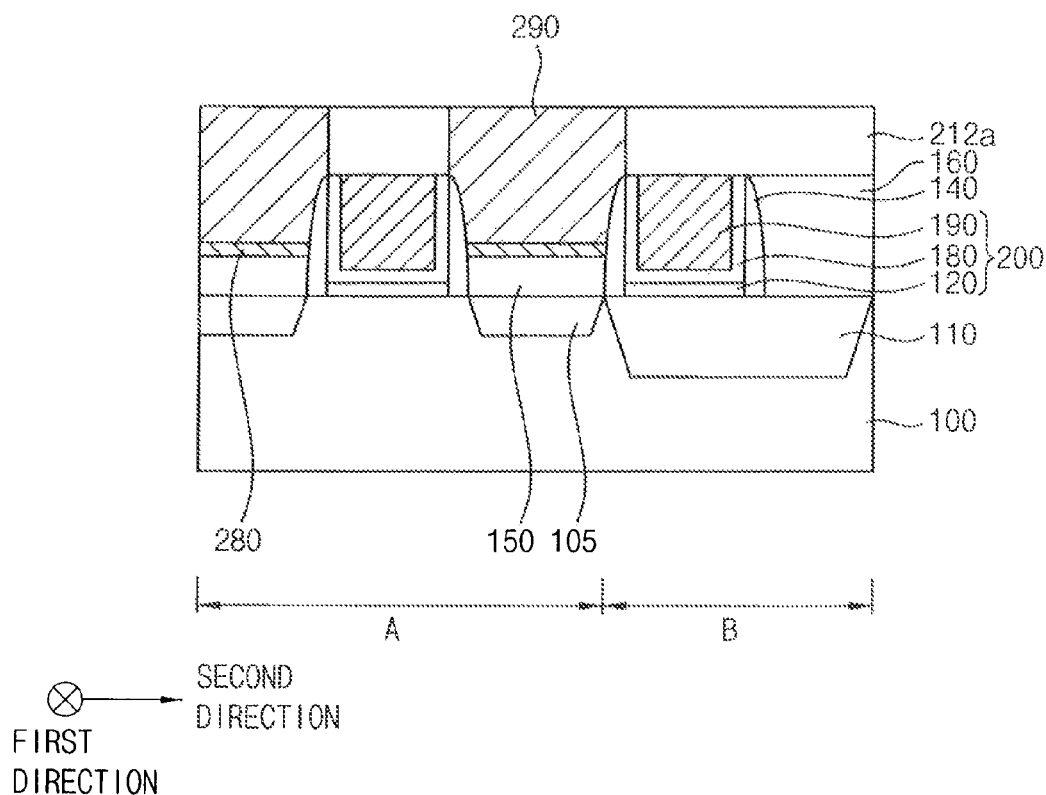

Referring to FIG. 11, a plug 290 may be formed on the metal silicide pattern 280 to fill a remaining portion of the first opening 270. Particularly, a conductive layer may be formed on the metal silicide pattern 280, the gate spacers 140, and the first etching mask 212 to sufficiently fill the first opening 270. An upper portion of the conductive layer may be planarized until the first etching mask 212 is exposed to form the plug 290. In exemplary embodiments, the conductive layer may be formed using a doped polysilicon, a metal, and/or a metal nitride.

The first opening 270 may be formed self-aligned with or disposed between the first etching mask 212 and the gate spacers 140, and thus the plug 290 filling the first opening 270 may be also formed self-aligned with or disposed between the first etching mask 212 and the gate spacers 140.

Figure 12:
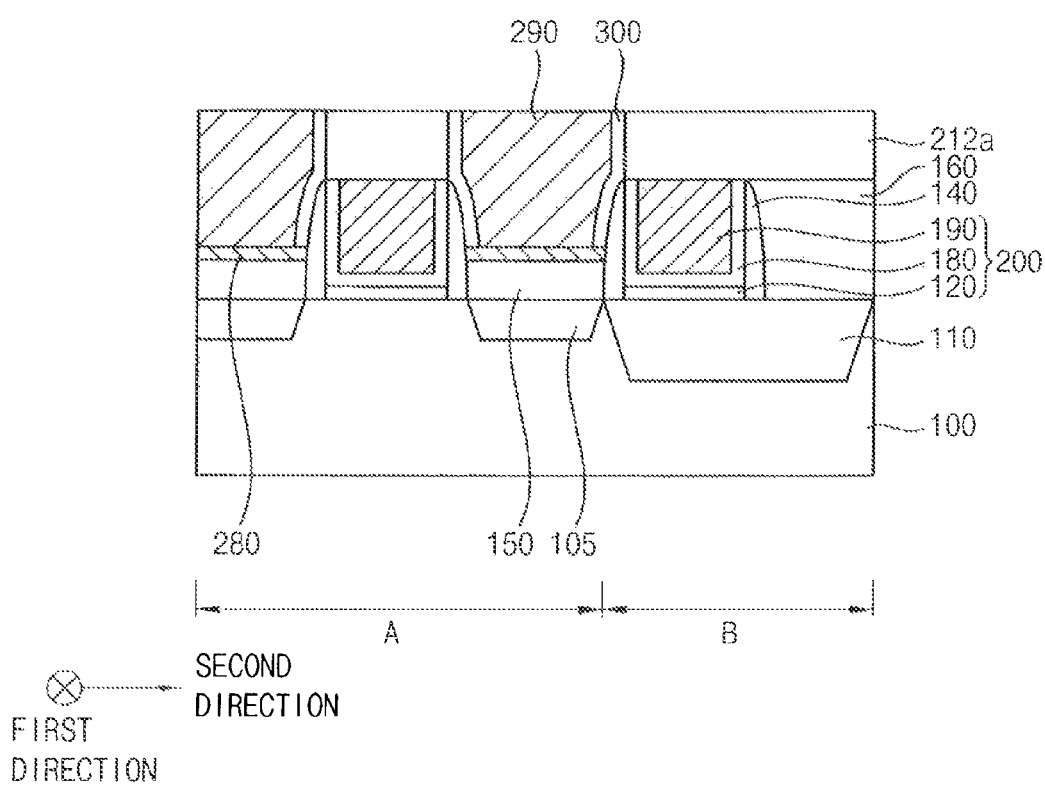

Referring to FIG. 12, before forming the plug 290, spacers 300 may be formed on sidewalls of the gate spacers 140 and the first etching mask 212. Particularly, a spacer layer may be formed on the metal silicide pattern 280, the gate spacers 140, and the first etching mask 212, and the conductive layer may be formed on the spacer layer to fill a remaining portion of the first opening 270. Upper portions of the spacer layer and the conductive layer may be planarized until the first etching mask 212 may be exposed to form both of the spacer 300 and the plug 290. In exemplary embodiments, the spacer 300 may be formed using silicon nitride.

As described above, the semiconductor device having the metal silicide pattern 280 and the plug 290 between the gate structures 200 may be formed. Various types of wirings (not illustrated) electrically connected to the plug 290 and insulating interlayers (not illustrated) may be further formed.

In the above method, a metal silicide pattern 280 and a plug 290 self-aligned with or disposed between the gate structures 200 may be formed using the first and the second etching masks 212 and 232. The first etching mask 212 may cover the gate structures 200, and the open area 232a of the second etching mask 232 may expose only the active region A and/or the first etching mask 212. Therefore, the first opening 270 for forming the metal silicide pattern 280 and the plug 290 may be formed using the first and the second etching masks 212 and 232.

FIG. 13 is a top view illustrating the layout of first and second etching masks used in a method of manufacturing a semiconductor device according to exemplary embodiments, and FIGS. 14 to 18 are cross-sectional views illustrating the method of manufacturing a semiconductor device according to exemplary embodiments. FIGS. 14 to 18 are cross-sectional views of the semiconductor device of FIG. 13 cut along the line I-I'. The method of manufacturing the semiconductor device may be substantially the same as or similar to that illustrated with reference to FIGS. 1 to 12, except a second hard mask and a planarization layer are formed. Thus, like reference numerals refer to like elements, and repetitive explanations are omitted here.

First, processes substantially the same as or similar to those illustrated with reference to FIGS. 2 to 5 may be performed to form gate structures 200, gate spacers 140, ESD layers 150, and a first insulating interlayer 160.

Figure 14:
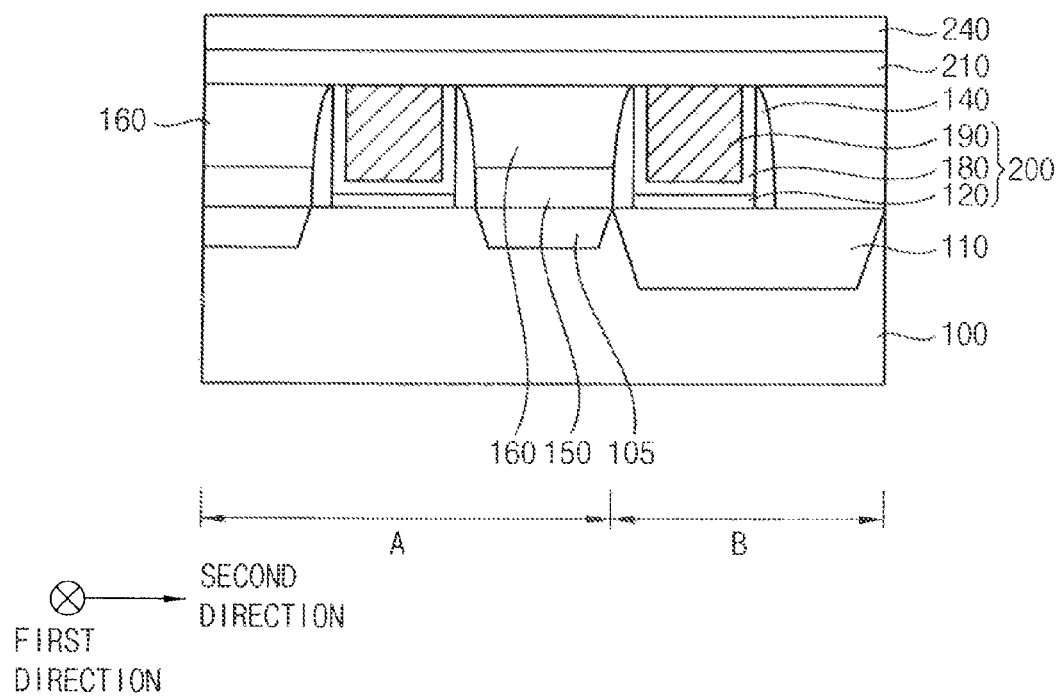

Referring to FIG. 14, a first hard mask layer 210 and a second hard mask layer 240 may be sequentially formed on the gate structures 200, the gate spacers 140, and the first insulating interlayer 160. In exemplary embodiments, the first hard mask layer 210 may be formed using silicon nitride, and the second hard mask layer 240 may be formed using silicon oxide.

Figure 15:
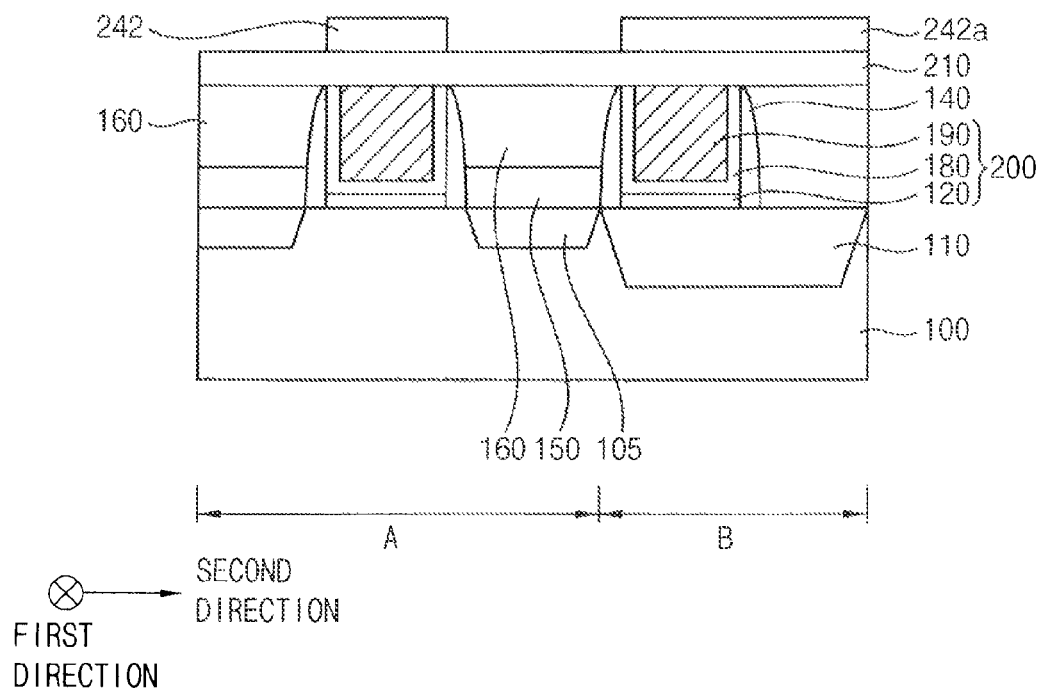

Referring to FIGS. 13 and 15, the second hard mask layer 240 may be patterned by a photolithography process to form a first etching mask 242, and a portion of the first hard mask layer 210 may be exposed. In exemplary embodiments, the first etching mask 242 may be formed to extend in a first direction and cover the gate structures 200, and may include a protrusion 242a protruding along a second direction substantially perpendicular to the first direction.

Figure 16:
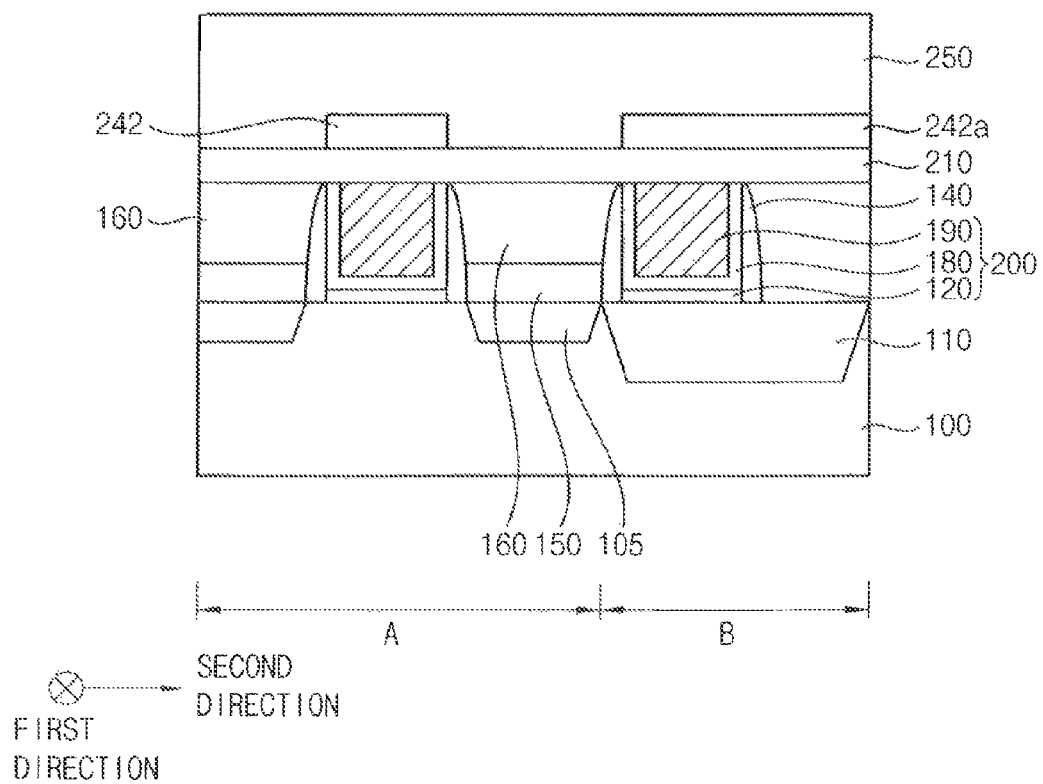

Referring to FIG. 16, a planarization layer 250 may be formed on the exposed portion of the first hard mask layer 210 and the first etching mask 242. The planarization layer 250 may be formed to a sufficient thickness, thereby having an even top surface on the exposed portion of the first hard mask layer 210 and the first etching mask 242. In an exemplary embodiment, a planarization process such as a CMP process may be performed on an upper portion of the planarization layer 250. In exemplary embodiments, the planarization layer 250 may be formed using a silicon-based spin-on-hard-mask (Si-SOH) or a carbon-based spin-on-hard-mask (C-SOH).

Figure 17:
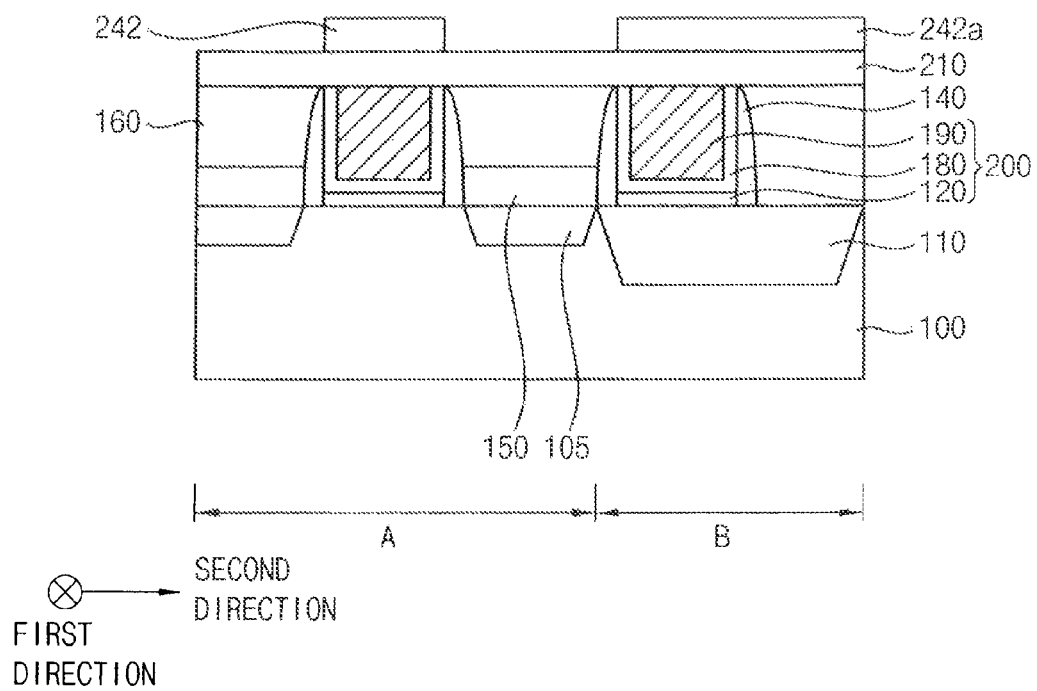

Referring to FIGS. 13 and 17, the planarization layer 250 may be patterned by a photolithography process to form a second etching mask 252. In exemplary embodiments, the second etching mask 252 may include an open area 252a that extends in the second direction and overlaps the active region A and the protrusion 242a of the first etching mask 242. The second etching mask 252 is not seen in FIG. 17 as the cross-section I-I' along which FIG. 17 is taken is in the open area 252a of the second etching mask 252 as shown in FIG. 13.

A hard mask (not illustrated) may be formed on the planarization layer 250, and the hard mask may be used as the second etching mask 252.

Figure 18:
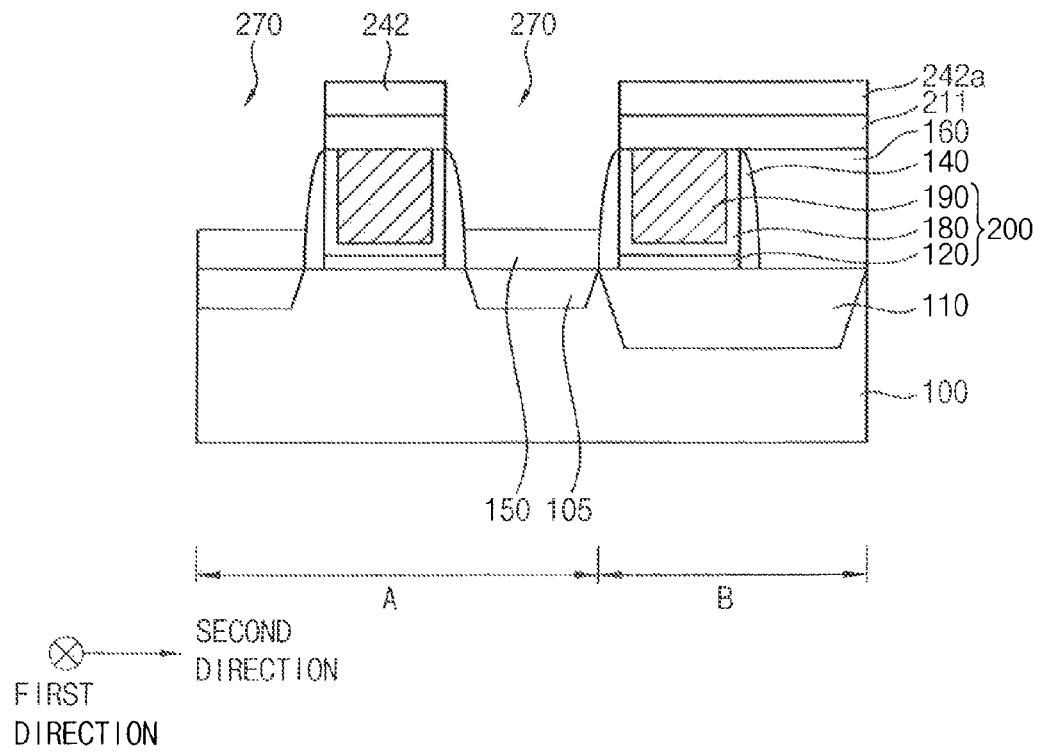

Referring to FIGS. 13 and 18, portions of the first hard mask layer 210 and the first insulating interlayer 160 that are not overlapped by the first etching mask 242 or by the second etching mask 252 may be removed to form a first opening 270 exposing the ESD layers 150 and to form a first hard mask pattern 211. In exemplary embodiments, portions of the first hard mask layer 210 and the first insulating interlayer 160 that are exposed by the open area 252a of the second etching mask 252 and not covered by the first etching mask 242 may be removed. Thus, portions of the first hard mask layer 210 and the first insulating interlayers 160 that are not overlapped by the first etching mask 242 or by the second etching masks 252 may be removed to form the first opening 270. The first hard mask layer 210 may be transformed into the first hard mask pattern 211 by the formation of the first opening 270.

The first opening 270 may be formed self-aligned with or disposed between the first hard mask pattern 211, the first etching mask 242 and the gate spacers 140.

After removing the first etching mask 242, processes substantially the same as or similar to those illustrated with reference to FIGS. 8 to 12 may be performed to manufacture the semiconductor device according to an exemplary embodiment.

FIGS. 19 to 21 are cross-sectional views illustrating methods of manufacturing a semiconductor device according to exemplary embodiments, and FIGS. 22 and 23 are top views illustrating layouts of first and second etching masks used in methods of manufacturing semiconductor devices according to exemplary embodiments. The method of manufacturing the semiconductor device may be substantially the same as or similar to that illustrated with reference to FIGS. 1 to 12, except for the formation of a planarization layer and a second etching mask. Thus, like reference numerals refer to like elements, and repetitive explanations are omitted here.

First, processes substantially the same as or similar to those illustrated with reference to FIGS. 2 to 7 may be performed.

Referring to FIGS. 19 and 22, after removing the photoresist pattern 222 shown in FIG. 7, a portion of the first insulating interlayer 160 exposed by the first etching mask 212 may be removed to form a first opening 270. Therefore, portions of the ESD layers 150 may be exposed.

A metal silicide pattern 280 may be formed on the ESD layers 150. Particularly, a metal layer may be formed on the ESD layers 150, the gate spacers 140, and the first etching mask 212, and a heat treatment process may be performed on the metal layer. Thus, a metal silicide layer may be formed on the ESD layers 150 having silicon. After removing a portion of the metal layer not reacted with silicon, a metal silicide pattern 280 may be formed on the portion of the ESD layers 150 exposed by the first opening 270.

Referring to FIG. 20, a planarization layer 250 may be formed on the metal silicide pattern 280, the gate spacers 140, and the first etching mask 212.

Referring to FIG. 21 and FIG. 23, the planarization layer 250 may be patterned by a photolithography process to form a second etching mask 252. In exemplary embodiments, the second etching mask 252 may include an open area 252a that extends in a second direction and overlaps a protrusion 212a of the first etching mask 212. In the process of forming the second etching mask 252, a portion of the planarization layer 250 that does not cover the first etching mask 212 may be removed. Thus, a second opening 275 exposing a portion of the metal silicide pattern 280 may be formed.

The second opening 275 may expose a portion of the metal silicide pattern 280 that is exposed by the open area 252a of the second etching mask 252 and not covered by the first etching mask 212. The second opening 275 may be formed self-aligned with or disposed between the first etching mask 212 and the gate spacers 140.

A hard mask (not illustrated) may be formed on the planarization layer 250, and the hard mask may be used as the second etching mask 252.

After removing the second etching mask 252, processes substantially the same as or similar to those illustrated with reference to FIGS. 11 and 12 may be performed to manufacture the semiconductor device and form the plugs 290 as shown in FIG. 23.

FIG. 24 to FIG. 26 are top views illustrating the layouts of first and second etching masks used in methods of manufacturing a semiconductor device according to exemplary embodiments. The methods of manufacturing the semiconductor device may include some of the methods illustrated with reference to FIGS. 1 to 23. Thus, only the layouts of the first and the second etching masks are illustrated here.

Referring to FIG. 24, a first etching mask 214 may extend in a first direction to cover gate structures 200, and a second etching mask 234 may extend in a second direction substantially perpendicular to the first direction to overlap an active region A.

The first etching mask 214 in FIG. 24, unlike the first etching mask 212 in FIG. 1, may have no protrusion protruding in the second direction. Additionally, the second etching mask 234 in FIG. 24, unlike the second etching mask 232 in FIG. 1, may have an open area 234a overlapping only the active region A. Therefore, a first opening, which may be formed by removing portions of first and second insulating interlayers that are not overlapped by the first etching mask 214 or by the second etching mask 234, may be formed at a location substantially the same as that of the first opening 270 illustrated with reference to FIGS. 1 to 12.

Referring to FIG. 25, a first etching mask 212 may have a shape substantially the same as or similar to that of the first etching mask 212 in FIG. 1. That is, the first etching mask 212 may cover gate structures 200 extending in a first direction and have a protrusion 212a protruding in a second direction substantially perpendicular to the first direction. A second etching mask 236 may include an open area 236a having an H-shape. That is, the open area 236a may have a shape in which adjacent two open areas 232a of FIG. 1 are connected to each other at a position under which the gate structures 200 are not formed.

Accordingly, a first opening may be formed in an active region A and in a field region B. Thus, adjacent two transistors along the first direction may be electrically connected to each other by a plug filling the first opening similar to as described above.

Referring to FIG. 26, like the first etching mask 212 of FIG. 1, a first etching mask 216 may cover most of gate structures 200 extending in a first direction and include a protrusion 216a protruding along a second direction substantially perpendicular to the first direction. However, the first etching mask 216 may further have a recess 216b corresponding to or aligning with the protrusion 216a. At the recess 216b, the first etching mask 216 may not overlap the gate structures 200. Although the protrusions 216a and the recesses 216b are shown to protrude or extend squarely or at right angles from/into the first etching mask 216, aspects need not be limited thereto such that the protrusions 216a and the recesses 216b may have another shape, for example, partially circular, and/or elliptical. Meanwhile, a second etching mask 232 may have a shape substantially the same as or similar to that of the second etching mask 232 of FIG. 1.

FIGS. 27 to 29 are cross-sectional views illustrating methods of manufacturing a semiconductor device according to exemplary embodiments. The etching masks used here may be the first and second etching masks 216 and 232 illustrated in FIG. 26.

First, processes substantially the same as or similar to those illustrated with reference to FIGS. 2 to 5 may be performed. Referring to FIGS. 26 and 27, a photoresist pattern 226 may be formed on the first hard mask layer 210, shown in FIG. 6. The first hard mask layer 210 may be patterned using the photoresist pattern 226 as an etching mask to form a first etching mask 216. The first etching mask 216 may expose a portion of the first insulating interlayer 160 and a portion of the gate structures 200.

Referring to FIGS. 26 and 28, processes substantially the same as or similar to those illustrated with reference to FIGS. 8 to 9 may be performed. Therefore, a first opening 270 exposing top surfaces of the ESD layers 150, the gate spacers 140, and the gate structures 200 may be formed.

Referring to FIG. 29, processes substantially the same as or similar to those illustrated with reference to FIGS. 10 to 11 may be performed. Thus, a metal silicide pattern 280 may be formed on the ESD layers 150, and a plug 295 filling a remaining portion of the first opening 270 may be formed on the ESD layers 150, the gate spacers 140, and the gate structures 200. The plug 295 may serve as a common contact plug electrically connected to the ESD layers 150, the impurity regions 105, and the gate structures 200.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of manufacturing a semiconductor device, the method comprising:
    forming a metal silicide pattern on a substrate, the metal silicide pattern being formed between metal gate structures disposed on the substrate and being formed according to a first mask, the forming the metal silicide pattern comprising:
        forming an impurity region in a surface of the substrate between the metal gate structures;
        forming an elevated source drain (ESD) layer on the impurity region; and
        forming the metal silicide pattern on the ESD layer; and
    forming a plug on at least portions of the metal silicide pattern according to a second mask that is formed on the first mask and the metal silicide pattern.

2. The method of claim 1, wherein the second mask is a patterned planarization layer.

3. The method of claim 1, wherein the metal silicide pattern is formed according to the first mask and the second mask.

4. The method of claim 1, wherein the forming of the plug further comprises forming the plug on at least a portion of at least one of the metal gate structures.

5. A method of manufacturing a semiconductor device, the method comprising:
    forming an impurity region at an upper portion of a substrate adjacent to a metal gate structure, the metal gate structure being formed on the substrate;
    forming an elevated source drain (ESD) layer on the impurity region;
    sequentially forming a first etching mask and a second etching mask on the metal gate structure and a first insulating interlayer, and the first insulating interlayer covering a sidewall of the metal gate structure, wherein the second etching mask is formed on the first etching mask;
    removing a portion of the first insulating interlayer that is not overlapped by the first etching mask or by the second etching mask to form an opening exposing a top surface of the substrate, and the opening exposing a top surface of the impurity region where the ESD layer is formed;
    removing the second etching mask and forming a metal silicide pattern on the top surface of the substrate exposed by the opening; and
    forming a plug on the metal silicide pattern to fill a remaining portion of the opening.

6. The method of claim 5, wherein the forming of the first and the second etching masks comprises:
    forming a first hard mask layer on the metal gate structure and the first insulating interlayer;
    patterning the first hard mask layer to form the first etching mask exposing a portion of the first insulating interlayer;
    forming a second insulating interlayer on the exposed portion of the first insulating interlayer to have a height substantially the same as that of the first etching mask; and
    forming the second etching mask on the first etching mask and the second insulating interlayer.

7. The method of claim 6, wherein the forming of the opening comprises:
    removing a portion of the second insulating interlayer that is not covered by the second etching mask to expose a portion of the first insulating interlayer; and
    removing a portion of the first insulating interlayer that is not covered by the first etching mask.

8. The method of claim 6, wherein the first hard mask layer is formed using silicon nitride, and the second etching mask is formed using a photoresist pattern.

9. The method of claim 5, wherein the substrate is divided into a field region in which an isolation layer is formed and an active region, and the metal gate structure extends in a first direction on the substrate,
    wherein the first etching mask extends in the first direction to cover the metal gate structure, and comprises a protrusion protruding in a second direction substantially perpendicular to the first direction,
    and wherein the second etching mask has an open area extending in the second direction and overlapping the active region and the protrusion of the first etching mask.

10. The method of claim 5, wherein the substrate is divided into a field region in which an isolation layer is formed and an active region, and the metal gate structure extends in a first direction on the substrate, wherein the first etching mask extends in the first direction to cover the metal gate structure, and wherein the second etching mask has an open area extending in a second direction substantially perpendicular to the first direction and overlapping the active region.

11. The method of claim 5, wherein the substrate is divided into a field region in which an isolation layer is formed and an active region, and the metal gate structure extends in a first direction on the substrate, wherein the first etching mask extends in the first direction to cover the metal gate structure, and comprises a protrusion protruding in a second direction substantially perpendicular to the first direction and a recess corresponding to the protrusion, wherein the metal gate structure is not covered by the first etching mask at the recess, and wherein the second etching mask extends in the second direction, and the second etching mask comprises an open area extending in the second direction and overlapping the protrusion and the recess of the first etching mask.

12. The method of claim 11, wherein the plug makes direct contact with a top surface of the metal gate structure.

13. The method of claim 5, further comprising forming a spacer on an inner wall of the opening before forming the metal silicide pattern.

14. The method of claim 5, further comprising a gate spacer on a sidewall of the metal gate structure.

15. The method of claim 14, wherein the plug is formed self-aligned with the gate spacer and the first etching mask.

* * * * *